US012563701B2

(12) United States Patent
Zhu et al.

(10) Patent No.: US 12,563,701 B2
(45) Date of Patent: Feb. 24, 2026

(54) LIQUID-COOLING CIRCULATING SYSTEM AND METHOD FOR SERVER, ELECTRONIC DEVICE AND STORAGE MEDIUM

(71) Applicant: SUZHOU METABRAIN INTELLIGENT TECHNOLOGY CO., LTD., Jiangsu (CN)

(72) Inventors: Huanlai Zhu, Jiangsu (CN); An Wu, Jiangsu (CN); Guangzhi Liu, Jiangsu (CN)

(73) Assignee: SUZHOU METABRAIN INTELLIGENT TECHNOLOGY CO., LTD., Jiangsu (KR)

( * ) Notice: Subject to any disclaimer, the term of this patent is extended or adjusted under 35 U.S.C. 154(b) by 0 days.

(21) Appl. No.: 18/873,667

(22) PCT Filed: Nov. 22, 2023

(86) PCT No.: PCT/CN2023/133235
§ 371 (c)(1),
(2) Date: Dec. 10, 2024

(87) PCT Pub. No.: WO2024/169302
PCT Pub. Date: Aug. 22, 2024

(65) Prior Publication Data
US 2025/0365896 A1 Nov. 27, 2025

(30) Foreign Application Priority Data
Feb. 15, 2023 (CN) .......................... 202310119636.7

(51) Int. Cl.
H05K 7/20 (2006.01)
(52) U.S. Cl.
CPC ..... H05K 7/20336 (2013.01); H05K 7/20309 (2013.01); H05K 7/20318 (2013.01);
(Continued)

(58) Field of Classification Search
CPC .......... H05K 7/20336; H05K 7/20309; H05K 7/20318; H05K 7/20327; H05K 7/20381; H05K 7/20809; H05K 7/20836
(Continued)

(56) References Cited

U.S. PATENT DOCUMENTS

2005/0141197 A1* 6/2005 Erturk ................... H01L 23/427
257/E23.088
2020/0042053 A1* 2/2020 Cheng ................ H05K 7/20509
(Continued)

FOREIGN PATENT DOCUMENTS

CN 110536591 A 12/2019
CN 111669952 A 9/2020
(Continued)

*Primary Examiner* — Mandeep S Buttar
*Assistant Examiner* — Kyle Oxenknecht
(74) *Attorney, Agent, or Firm* — IPro, PLLC

(57) ABSTRACT

A liquid-cooling cycle system includes at least one composite phase change heat sink structure, and each composite phase change heat sink structure at least includes a composite phase change heat sink main body and two flexible oscillating heat pipes respectively connected to two sides of the composite phase change heat sink main body through interface structures, so that in the liquid-cooling cycle process of a server, phase change conversion between a-gaseous refrigerant and liquid refrigerant may be achieved by means of the flexible oscillating heat pipes and the composite phase change heat sink main body. During maintenance of the server, quick and convenient maintenance may be carried out simply by disassembling the flexible oscillating heat pipes.

20 Claims, 8 Drawing Sheets

(52) U.S. Cl.
CPC ..... *H05K 7/20327* (2013.01); *H05K 7/20381*
(2013.01); *H05K 7/20809* (2013.01); *H05K*
*7/20836* (2013.01)

(58) Field of Classification Search
USPC ......................................................... 361/700
See application file for complete search history.

(56) References Cited

U.S. PATENT DOCUMENTS

| | | | | |
|---|---|---|---|---|
| 2020/0400380 | A1* | 12/2020 | Ma ...................... | F28D 15/0266 |
| 2021/0254899 | A1* | 8/2021 | Alahyari ............. | F28D 15/0266 |

FOREIGN PATENT DOCUMENTS

| | | | |
|---|---|---|---|
| CN | 212411145 | U | 1/2021 |
| CN | 112394792 | A | 2/2021 |
| CN | 112885798 | A | 6/2021 |
| CN | 113115574 | A | 7/2021 |
| CN | 114485230 | A | 5/2022 |
| CN | 115981434 | A | 4/2023 |

* cited by examiner heat source main body 202 first heat source main body 2021 second heat source main body 2021 server motherboard 201 composite phase change heat sink main body 301 micro/nano boiling enhancement structure 3011 heat absorption section of the flexible oscillating heat pipe 302 heat release section of the flexible oscillating heat pipe 303 flexible section 304

Schematic diagram of the relationship between the saturation temperature and the saturated vapor pressure of electronic fluorinated liquid FC-3284 composite phase change heat sink main body 501 micro/nano boiling enhancement structure 502 (wedge-shaped structure section)

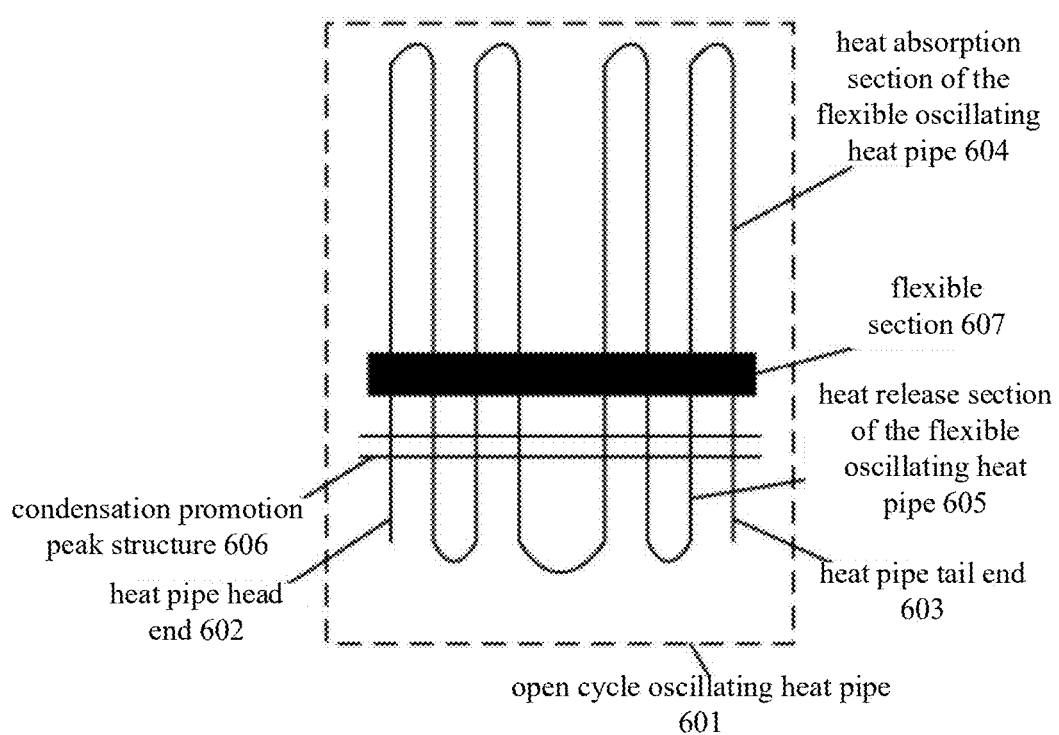

heat absorption section of the flexible oscillating heat pipe 604 flexible section 607 heat release section of the flexible oscillating heat pipe 605 heat pipe tail end 603 condensation promotion peak structure 606 heat pipe head end 602 open cycle oscillating heat pipe 601

FIG. 6

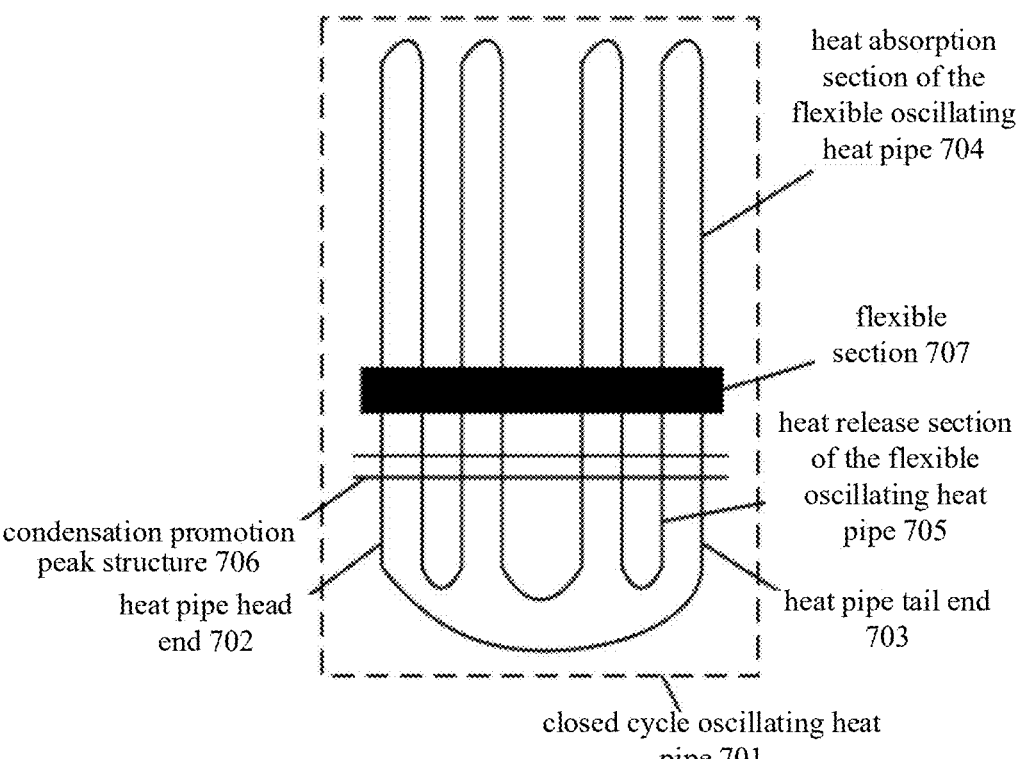

heat absorption section of the flexible oscillating heat pipe 704 flexible section 707 heat release section of the flexible oscillating heat pipe 705 heat pipe tail end 703 condensation promotion peak structure 706 heat pipe head end 702 closed cycle oscillating heat pipe 701

FIG. 7 by the flexible oscillating heat pipe, absorbing heat source heat of the server motherboard, and heating a first liquid refrigerant in the secondary side refrigerant to a saturated liquid state according to the heat source heat

1001 by the composite phase change heat sink main body, absorbing the heat source heat of the server motherboard, transporting a gaseous refrigerant in the secondary side refrigerant to the condenser for cooling treatment, and receiving a second liquid refrigerant returned by the first cycle pump to complete a liquid cooling cycle for the server

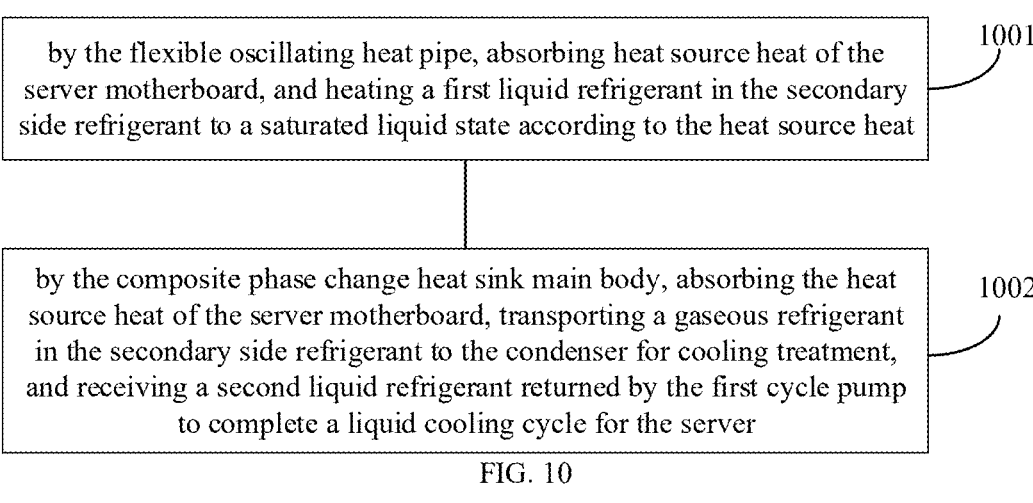

computer-readable storage medium

FIG. 11

LIQUID-COOLING CIRCULATING SYSTEM AND METHOD FOR SERVER, ELECTRONIC DEVICE AND STORAGE MEDIUM

CROSS-REFERENCE TO RELATED APPLICATION

The present application claims the priority of the Chinese patent application filed on Feb. 15, 2023 before the CNIPA, China National Intellectual Property Administration with the application number of 202310119636.7 and the title of "LIQUID COOLING CYCLE SYSTEM AND METHOD FOR SERVER, ELECTRONIC DEVICE AND STORAGE MEDIUM", which is incorporated herein in its entirety by reference.

FIELD

The present application relates to the technical field of liquid cooling servers and more particularly, to a liquid cooling cycle system for a server, a liquid cooling cycle method for a server, an electronic device and a non-transitory computer-readable storage medium.

BACKGROUND

For servers, current mainstream liquid-cooling heat-dissipation methods mainly include a phase change liquid-cooling heat-dissipation method and a non-phase change liquid-cooling heat-dissipation method. Compared with the non-phase change liquid-cooling heat-dissipation method, using the phase change liquid-cooling heat-dissipation method may quickly and efficiently remove heat through the phase change of the coolant, so that a higher heat transfer coefficient is increased by an order of magnitude, the heat dissipation efficiency is higher, and the pump power consumption and PUE (Power Usage Effectiveness) are lower. Among them, the commonly used phase change liquid-cooling heat-dissipation method is the immersion phase change liquid-cooling heat-dissipation method, which uses coolant to immerse all heating components of the server, such as high power CPU (Central Processing Unit), GPU (Graphic Processing Unit), etc., thus, the heat dissipation of the server may be achieved through the phase change reaction occurring on the surface of the radiator on the CPU or GPU.

If the immersion phase change liquid-cooling heat-dissipation method is used to perform liquid cooling treatment on the server, it is easy to make it unable to maintain the server conveniently and quickly, and due to the two-phase boiling state inside the immersion liquid cooling chamber during shutdown, there is a certain risk of heat dissipation.

SUMMARY

Embodiments of the present application provide a liquid cooling cycle system and method for a server, an electronic device and a non-transitory computer-readable storage medium, to solve or partially solve the problem of unable to maintain the server conveniently and quickly in related liquid cooling technology of the server.

An embodiment of the present application discloses a liquid cooling cycle system applied to a server, the liquid cooling cycle system includes at least a secondary side cycle module, the secondary side cycle module includes secondary side refrigerant, a condenser, a first cycle pump connected to the condenser, and at least one composite phase change heat sink structure, among them, each composite phase change heat sink structure includes at least a composite phase change heat sink main body, and two flexible oscillating heat pipes respectively connected to two sides of the composite phase change heat sink main body through interface structures, and a server motherboard is placed between the composite phase change heat sink main body and one flexible oscillating heat pipe of the two flexible oscillating heat pipes;

the flexible oscillating heat pipe is used for absorbing heat source heat of the server motherboard, and heating first liquid refrigerant in the secondary side refrigerant to a saturated liquid state according to the heat source heat; and the composite phase change heat sink main body is used for absorbing the heat source heat of the server motherboard, transporting gaseous refrigerant in the secondary side refrigerant to the condenser for cooling treatment, and receiving second liquid refrigerant returned by the first cycle pump to complete a liquid cooling cycle for the server.

In some embodiments, the condenser is used for:

performing the cooling treatment on the gaseous refrigerant to obtain second liquid refrigerant corresponding to the gaseous refrigerant, and transporting the second liquid refrigerant to the first cycle pump.

In some embodiments, the first cycle pump is used for:

receiving the second liquid refrigerant transported by the condenser, and cyclically driving the second liquid refrigerant into interior of the composite phase change heat sink main body.

In some embodiments, interior of the composite phase change heat sink main body stores third liquid refrigerant, and the composite phase change heat sink main body is used for:

absorbing the heat source heat of the server motherboard, and performing vaporization treatment on the third liquid refrigerant according to the heat source heat, to obtain gaseous refrigerant corresponding to the third liquid refrigerant.

In some embodiments, the interior of the composite phase change heat sink main body is a micro/nano boiling enhancement structure, the micro/nano boiling enhancement structure is formed by a compounding process, and the compounding process includes at least sintering, screen printing, fibers, and grooves.

In some embodiments, a section of the micro/nano boiling enhancement structure is a wedge-shaped structure section, the wedge-shaped structure section is used for accelerating discharge of bottom bubbles from the composite phase change heat sink main body when performing the vaporization treatment on the third liquid refrigerant.

In some embodiments, the micro/nano boiling enhancement structure is an inclined plane structure with an exponential curve characteristic, and the exponential curve characteristic is used for balancing a boiling point difference at a bottom of the composite phase change heat sink main body.

In some embodiments, the liquid cooling cycle system includes a control module, and the control module is used for:

performing on-off control on the server motherboard, and performing cycle control on the first cycle pump.

In some embodiments, the liquid cooling cycle system includes a data collection module, and the data collection module is used for:

collecting liquid cooling data of the liquid cooling cycle system, wherein the liquid cooling data includes at least saturation temperature data and saturated vapor pressure data of the secondary side refrigerant, and temperature data of the server motherboard.

In some embodiments, the server motherboard includes a first heat source main body and a second heat source main body, a motherboard surface where the first heat source main body is located is opposite to a motherboard surface where the second heat source main body is located; and a surface of the first heat source main body is covered with the flexible oscillating heat pipe, and a surface of the second heat source main body is covered with the composite phase change heat sink main body.

In some embodiments, the liquid cooling cycle system further includes a primary side cycle module connected to the condenser, the primary side cycle module includes a second cycle pump and a heat dissipation end structure connected to the second cycle pump.

In some embodiments, the primary side cycle module further includes primary side cooling water, the primary side cooling water is used for performing the cooling treatment for the condenser, and the second cycle pump is used for:

transporting the primary side cooling water flowing through the condenser to the heat dissipation end structure; and the heat dissipation end structure is used for performing heat dissipation and cooling treatment for the primary side cooling water, and returning the primary side cooling water after the heat dissipation and cooling treatment to the condenser.

In some embodiments, the flexible oscillating heat pipe includes a heat pipe head end and a heat pipe tail end, the flexible oscillating heat pipe is an open cycle oscillating heat pipe, and the open cycle oscillating heat pipe represents that the heat pipe head end is not connected to the heat pipe tail end.

In some embodiments, the flexible oscillating heat pipe includes a heat pipe head end and a heat pipe tail end, the flexible oscillating heat pipe is a closed cycle oscillating heat pipe, and the closed cycle oscillating heat pipe represents that the heat pipe head end is connected to the heat pipe tail end.

In some embodiments, the flexible oscillating heat pipe includes a heat absorption section of the flexible oscillating heat pipe and a heat release section of the flexible oscillating heat pipe, and the heat release section of the flexible oscillating heat pipe is used for:

releasing the heat source heat after the heat absorption section of the flexible oscillating heat pipe absorbs the heat source heat of the server motherboard, heating the first liquid refrigerant in the secondary side refrigerant to the saturated liquid state.

In some embodiments, the flexible oscillating heat pipe includes a condensation promotion peak structure, and the condensation promotion peak structure is used for:

when the secondary side refrigerant is converted from a liquid state to a gaseous state, promoting boiling of the secondary side refrigerant; and when the secondary side refrigerant is converted from the gaseous state to the liquid state, promoting condensation of the secondary side refrigerant.

In some embodiments, a connection between the heat absorption section of the flexible oscillating heat pipe and the heat release section of the flexible oscillating heat pipe is provided with a flexible section, and the flexible section is a flexible metal sheathed with a metal woven wire mesh.

An embodiment of the present application further discloses a liquid cooling cycle method applied to a server, the liquid cooling cycle method is applied to a liquid cooling cycle system of a server, the liquid cooling cycle system includes at least a secondary side cycle module, the secondary side cycle module includes secondary side refrigerant, a condenser, a first cycle pump connected to the condenser, and at least one composite phase change heat sink structure, among them, each composite phase change heat sink structure includes at least a composite phase change heat sink main body, and two flexible oscillating heat pipes respectively connected to two sides of the composite phase change heat sink main body through interface structures, and a server motherboard is placed between the composite phase change heat sink main body and one flexible oscillating heat pipe of the two flexible oscillating heat pipes; and the method includes:

by the flexible oscillating heat pipe, absorbing heat source heat of the server motherboard, and heating first liquid refrigerant in the secondary side refrigerant to a saturated liquid state according to the heat source heat; and by the composite phase change heat sink main body, absorbing the heat source heat of the server motherboard, transporting gaseous refrigerant in the secondary side refrigerant to the condenser for cooling treatment, and receiving second liquid refrigerant returned by the first cycle pump to complete a liquid cooling cycle for the server.

In some embodiments, the method further includes:

by the condenser, performing the cooling treatment on the gaseous refrigerant to obtain second liquid refrigerant corresponding to the gaseous refrigerant, and transporting the second liquid refrigerant to the first cycle pump.

In some embodiments, the method further includes:

by the first cycle pump, receiving the second liquid refrigerant transported by the condenser, and cyclically driving the second liquid refrigerant into interior of the composite phase change heat sink main body.

In some embodiments, interior of the composite phase change heat sink main body stores third liquid refrigerant, and by the composite phase change heat sink main body, absorbing the heat source heat of the server motherboard includes:

by the composite phase change heat sink main body, absorbing the heat source heat of the server motherboard, and performing vaporization treatment on the third liquid refrigerant according to the heat source heat, to obtain gaseous refrigerant corresponding to the third liquid refrigerant.

In some embodiments, the interior of the composite phase change heat sink main body is a micro/nano boiling enhancement structure, the micro/nano boiling enhancement structure is formed by a compounding process, and the compounding process includes at least sintering, screen printing, fibers, and grooves.

In some embodiments, a section of the micro/nano boiling enhancement structure is a wedge-shaped structure section, the wedge-shaped structure section is used for accelerating discharge of bottom bubbles from the composite phase change heat sink main body when performing the vaporization treatment on the third liquid refrigerant.

In some embodiments, the micro/nano boiling enhancement structure is an inclined plane structure with an exponential curve characteristic, and the exponential curve characteristic is used for balancing a boiling point difference at a bottom of the composite phase change heat sink main body.

5

In some embodiments, the liquid cooling cycle system includes a control module, and the method further includes:

by the control module, performing on-off control on the server motherboard, and performing cycle control on the first cycle pump.

In some embodiments, the liquid cooling cycle system includes a data collection module, and the method further includes:

by the data collection module, collecting liquid cooling data of the liquid cooling cycle system, wherein the liquid cooling data includes at least saturation temperature data and saturated vapor pressure data of the secondary side refrigerant, and temperature data of the server motherboard.

In some embodiments, the server motherboard includes a first heat source main body and a second heat source main body, a motherboard surface where the first heat source main body is located is opposite to a motherboard surface where the second heat source main body is located; and a surface of the first heat source main body is covered with the flexible oscillating heat pipe, and a surface of the second heat source main body is covered with the composite phase change heat sink main body.

In some embodiments, the liquid cooling cycle system further includes a primary side cycle module connected to the condenser, the primary side cycle module includes a second cycle pump and a heat dissipation end structure connected to the second cycle pump.

In some embodiments, the primary side cycle module further includes primary side cooling water, the primary side cooling water is used for performing the cooling treatment for the condenser, and the method further includes:

by the second cycle pump, transporting the primary side cooling water flowing through the condenser to the heat dissipation end structure; and by the heat dissipation end structure, performing heat dissipation and cooling treatment for the primary side cooling water, and returning the primary side cooling water after the heat dissipation and cooling treatment to the condenser.

In some embodiments, the flexible oscillating heat pipe includes a heat pipe head end and a heat pipe tail end, the flexible oscillating heat pipe is an open cycle oscillating heat pipe, and the open cycle oscillating heat pipe represents that the heat pipe head end is not connected to the heat pipe tail end.

In some embodiments, the flexible oscillating heat pipe includes a heat pipe head end and a heat pipe tail end, the flexible oscillating heat pipe is a closed cycle oscillating heat pipe, and the closed cycle oscillating heat pipe represents that the heat pipe head end is connected to the heat pipe tail end.

In some embodiments, the flexible oscillating heat pipe includes a heat absorption section of the flexible oscillating heat pipe and a heat release section of the flexible oscillating heat pipe, and the method further includes:

by the heat release section of the flexible oscillating heat pipe, releasing the heat source heat after the heat absorption section of the flexible oscillating heat pipe absorbs the heat source heat of the server motherboard, and heating the first liquid refrigerant in the secondary side refrigerant to the saturated liquid state.

In some embodiments, the flexible oscillating heat pipe includes a condensation promotion peak structure, and the method further includes:

when the secondary side refrigerant is converted from a liquid state to a gaseous state, promoting, by the condensation promotion peak structure, boiling of the secondary side refrigerant; and when the secondary side refrigerant is converted from the gaseous state to the liquid state, promoting, by the condensation promotion peak structure, condensation of the secondary side refrigerant.

In some embodiments, a connection between the heat absorption section of the flexible oscillating heat pipe and the heat release section of the flexible oscillating heat pipe is provided with a flexible section, and the flexible section is a flexible metal sheathed with a metal woven wire mesh.

An embodiment of the present application further discloses an electronic device, including a processor, a communication interface, a memory, and a communication bus, and the processor, the communication interface, and the memory communicate with each other through the communication bus;

the memory is used for storing a computer program; and the processor is used for, when executing the program stored on the memory, implementing the method according to embodiments of the present application.

An embodiment of the present application further discloses a non-transitory computer-readable storage medium, storing instructions that, when executed by one or more processors, cause the processors to perform the method according to embodiments of the present application.

The embodiment of the present application includes the following advantages:

in the embodiments of the present application, a liquid cooling cycle system applied to a server and corresponding liquid cooling cycle method are provided, among them, the liquid cooling cycle system includes at least one composite phase change heat sink structure, each composite phase change heat sink structure includes at least a composite phase change heat sink main body, and two flexible oscillating heat pipes respectively connected to two sides of the composite phase change heat sink main body through interface structures, so that during the liquid cooling cycle process of the server, the phase change conversion between the gaseous refrigerant and the liquid refrigerant may be achieved through the flexible oscillating heat pipes and the composite phase change heat sink main body. When maintaining the server, it only needs to disassemble the flexible oscillating heat pipe for quick and convenient maintenance. At the same time, by designing the interior of the composite phase change heat sink main body as a compensating exponential curve slope and increasing the boiling heat transfer area of the bottom heat source, the temperature of the heat sources of different heights inside the heat sink main body may be consistent, and the risk of heat dissipation is greatly reduced.

BRIEF DESCRIPTION OF THE DRAWINGS

FIG. 6 is a schematic diagram of an unfolded structure of a flexible oscillating heat pipe according to an embodiments of the present application;

FIG. 7 is a schematic diagram of an unfolded structure of another flexible oscillating heat pipe according to an embodiments of the present application;

FIG. 10 is a flow chart of steps of a liquid cooling cycle method for a server according to an embodiment of the present application;

FIG. 11 is a schematic diagram of a non-transitory computer-readable storage medium according to an embodiment of the present application.

DETAILED DESCRIPTION

Figure 1:
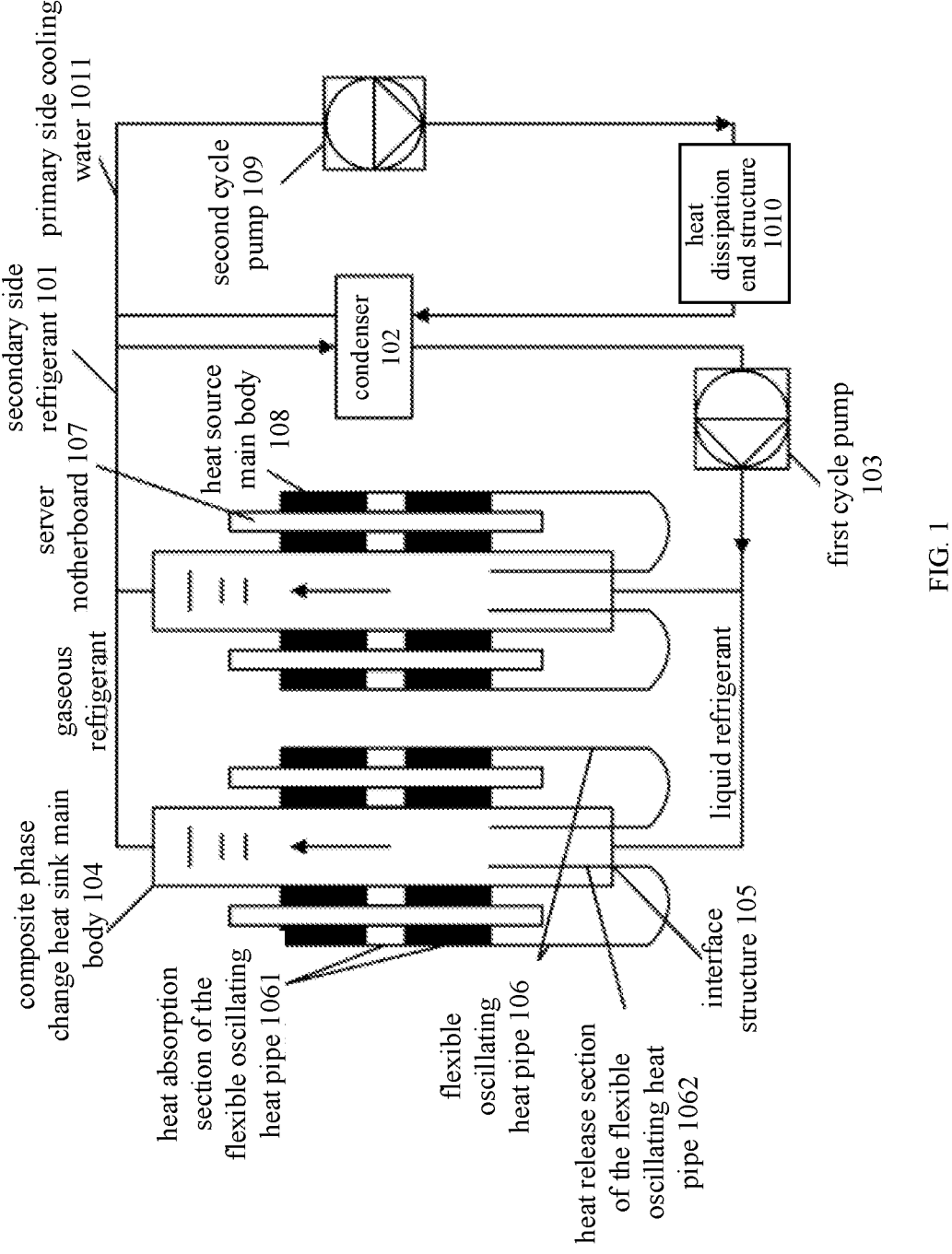
FIG. 1 is a schematic diagram of a liquid cooling cycle system for a server according to an embodiment of the present application.

In order to make the above objectives, features, and advantages of the present application more obvious and understandable, the following will provide further detailed explanations of the present application in conjunction with the accompanying drawings and implementation methods.

As an example, for servers, current mainstream liquid-cooling heat-dissipation methods mainly include phase change liquid-cooling heat-dissipation method and non-phase change liquid-cooling heat-dissipation method. Compared with the non-phase change liquid-cooling heat-dissipation method, using the phase change liquid-cooling heat-dissipation method may quickly and efficiently remove heat through the phase change of the coolant, so that a higher heat transfer coefficient is increased by an order of magnitude, the heat dissipation efficiency is higher, and the pump power consumption and PUE (Power Usage Effectiveness) are lower. Among them, the commonly used phase change liquid-cooling heat-dissipation method is the immersion phase change liquid-cooling heat-dissipation method, which uses coolant to immerse all heating components of the server, such as high power CPU (Central Processing Unit), GPU (Graphic Processing Unit), etc., thus, the heat dissipation of the server may be achieved through the phase change reaction occurring on the surface of the radiator on the CPU or GPU.

If the immersion phase change liquid-cooling heat-dissipation method is used to perform liquid cooling treatment on the server, when maintenance is required for a malfunctioning server, it is required to remove the server from the immersion liquid cooling chamber. However, due to the two-phase boiling state inside the chamber during shutdown, the server may only be removed after the internal gaseous refrigerant has completely condensed into liquid. At the same time, when removing the server, the surface needs to be drained of the coolant carried out from the immersion liquid cooling chamber, and the server needs to be thoroughly cleaned before maintenance. At the same time, during installation, a sealing test needs to be conducted to ensure that the internal sealing of the immersion liquid cooling chamber is qualified before injection, and then the system may be connected and started up for operation. In the above process, although designing separate maintenance tooling for the server, which includes a recovery coolant device for draining the coolant, cleaning tooling, and injection vehicles, they may solve the maintainability problems of the immersion phase change liquid cooling method to some extent. However, the maintenance process involves a series of complex operations, which makes it unable to maintain the server conveniently and quickly. At the same time, when performing liquid cooling treatment on the server, the entire server needs to be immersed in the immersion liquid cooling chamber, thus requiring more coolant, such as the commonly used electronic fluorinated liquid FC-3284. Expensive coolant will greatly increase maintenance costs. In addition, the immersion liquid cooling chamber has liquid level pressure-force differences at different heights. According to the liquid pressure calculation formula $P=\rho gh$, the pressure force at the lower part of the immersion liquid cooling chamber is high. Due to the positive correlation between the boiling point of the phase change liquid and the pressure force, it is easy to cause the boiling point of the lower part to be high, which may lead to the temperature of the lower heat source main body, such as the CPU, being higher than that of the upper heat source main body. Especially when using liquids with high density and immersing the liquid cooling chamber too high, the temperature of the lower CPU will be too high. Due to the two-phase boiling state inside the immersion liquid cooling chamber during shutdown, it is easy to cause significant heat dissipation risks.

One of the core inventive points of the embodiments of the present application is that: a liquid cooling cycle system applied to a server and corresponding liquid cooling cycle method are provided, among them, the liquid cooling cycle system includes at least one composite phase change heat sink structure, each composite phase change heat sink structure includes at least a composite phase change heat sink main body, and two flexible oscillating heat pipes respectively connected to two sides of the composite phase change heat sink main body through interface structures, so that during the liquid cooling cycle process of the server, the phase change conversion between gaseous refrigerant and liquid refrigerant may be achieved through the flexible oscillating heat pipes and the composite phase change heat sink main body. When maintaining the server, it only needs to disassemble the flexible oscillating heat pipe for quick and convenient maintenance. At the same time, by designing the interior of the composite phase change heat sink main body as a compensating exponential curve slope and increasing the boiling heat transfer area of the bottom heat source, the temperature of the heat sources of different heights inside the heat sink main body may be consistent, and the risk of heat dissipation is greatly reduced.

Referring to FIG. 1, a schematic diagram of a liquid cooling cycle system for a server according to an embodiment of the present application is shown.

The liquid cooling cycle system may include at least a secondary side cycle module, the secondary side cycle module may include secondary side refrigerant 101, a condenser 102, a first cycle pump 103 connected to the condenser 102, and at least one composite phase change heat sink structure, among them, each composite phase change heat sink structure may include at least a composite phase change heat sink main body 104, and two flexible oscillating heat pipes 106 respectively connected to two sides of the composite phase change heat sink main body 104 through interface structures 105 (such as welding or quick connectors), and a server motherboard 107 is placed between the composite phase change heat sink main body 104 and one flexible oscillating heat pipe 106 of the two flexible oscillating heat pipes. The server motherboard 107 includes a heat source main body 108, the heat source main body 108 represents components on the server motherboard that emit heat source heat due to the operation of the server, such as the CPU.

Furthermore, the working principle of the liquid cooling cycle system according to the embodiments of the present application may be as follows: for the secondary side cycle module in the liquid cooling cycle system, during the operation of the server, the server motherboard will release heat source heat. After the heat absorption section (also known as the evaporation section) of the flexible oscillating heat pipe absorbs heat, the heat release section (also known as the condensation section) of the flexible oscillating heat pipe releases the heat to preheat the coolant with a certain supercooling degree and heat the coolant to a saturated liquid state. At the same time, after the composite phase change heat sink main body absorbs the heat source heat, the gaseous refrigerant (also known as gaseous cooling working fluid, such as the commonly used refrigerant tetrafluoroethane R134A) enters the condenser from the top outlet of the composite phase change heat sink main body. After cooling to a certain supercooling degree, it is converted into liquid refrigerant and driven by the first cycle pump to flow into the interior of the phase change heat sink main body structure, to complete one liquid cooling cycle.

In some implementations, combined with FIG. 1, the flexible oscillating heat pipe 106 is used for absorbing the heat source heat of the server motherboard 107, and heating first liquid refrigerant in the secondary side refrigerant 101 to the saturated liquid state according to the heat source heat. Among them, the flexible oscillating heat pipe 106 includes a heat absorption section of the flexible oscillating heat pipe 1061 and a heat release section of the flexible oscillating heat pipe 1062, the heat absorption section of the flexible oscillating heat pipe 1061 is used for absorbing the heat source heat of the server motherboard 107, and the heat release section of the flexible oscillating heat pipe 1062 is used for releasing the heat source heat after the heat absorption section of the flexible oscillating heat pipe 1061 absorbs the heat source heat of the server motherboard 107, and heating the first liquid refrigerant in the secondary side refrigerant 101 to the saturated liquid state.

At the same time, the composite phase change heat sink main body 104 is used for absorbing the heat source heat of the server motherboard 107, transporting gaseous refrigerant in the secondary side refrigerant 101 to the condenser 102. Next, the condenser 102 may perform cooling treatment on the gaseous refrigerant, to obtain second liquid refrigerant corresponding to the gaseous refrigerant, and transport the second liquid refrigerant to the first cycle pump 103. And then, the first cycle pump 103 may receive the second liquid refrigerant transported by the condenser 102, and cyclically drive the second liquid refrigerant into interior of the composite phase change heat sink main body 104. The composite phase change heat sink main body 104 may receive second liquid refrigerant returned by the first cycle pump 103 to complete a liquid cooling cycle for the server.

In some embodiments, the liquid cooling cycle system may further include a primary side cycle module connected to the condenser 102, the primary side cycle module may include a second cycle pump 109 and a heat dissipation end structure 1010 connected to the second cycle pump 109. At the same time, the primary side cycle module further includes primary side cooling water 1011, the primary side cooling water 1011 is used for performing the cooling treatment for the condenser 102. Thus, the liquid cooling cycle process of the primary side cycle module may be: by the second cycle pump 109, transporting the primary side cooling water 1011 flowing through the condenser 102 to the heat dissipation end structure 1010, next, by the heat dissipation end structure, performing heat dissipation and cooling treatment for the primary side cooling water 1011, and returning the primary side cooling water 1011 after the heat dissipation and cooling treatment to the condenser 102. In addition to achieving the liquid cooling cycle for the server through the cycle operation of the composite phase change heat sink structures, the condenser, and the cycle pump, auxiliary heat dissipation may also be achieved for the condenser through the cooling water cycle method, thus accelerating heat dissipation speed and improving liquid cooling cycle efficiency.

Figure 2:
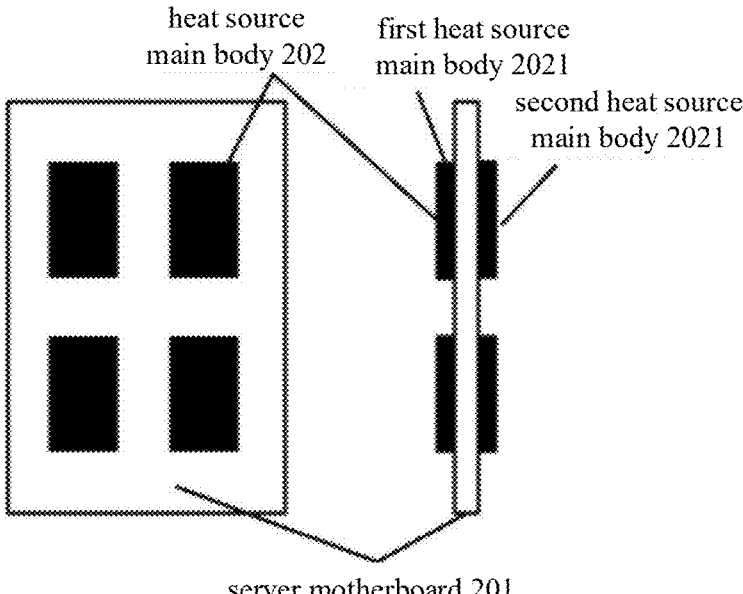
FIG. 2 is a schematic structural diagram of a heat source main body of a server motherboard according to an embodiment of the present application.

As can be seen from the above content, the server motherboard includes a heat source main body that emits the heat source heat during the operation of the server, such as a CPU that emits a lot of heat. For example, referring to FIG. 2, a schematic structural diagram of a heat source main body of a server motherboard according to an embodiment of the present application is shown.

It should be understood that the left schematic diagram is a front schematic diagram of the server motherboard, and the right schematic diagram is a side schematic diagram of the server motherboard. The server motherboard 201 may include a heat source main body 202, such as a first heat source main body 2021 and a second heat source main body 2022, a motherboard surface where the first heat source main body 2021 is located is opposite to a motherboard surface where the second heat source main body 2022 is located. Among them, a surface of the first heat source main body 2021 may be covered with the flexible oscillating heat pipe, and a surface of the second heat source main body 2022 may be covered with the composite phase change heat sink main body. That is, two sides of the printed circuit board (PCB) of the server motherboard are fully covered with the composite phase change heat sink main body and the flexible oscillation heat pipes, so as to achieve an immersive high-density phase change full liquid cooling heat dissipation similar to immersion liquid cooling by covering all heat sources on the two sides of the server motherboard, such as the CPU. Therefore, when maintenance of the server is needed, only the flexible oscillation heat pipe needs to be disassembled to achieve convenient maintenance, without the need to design separate maintenance tooling for the server. At the same time, due to the usage of the liquid cooling cycle system provided in the embodiment of the present application, there is no need to fully immerse the PCB, the heat sources, and the heat sink, which may save a lot of expensive coolant and greatly reduce maintenance costs.

In some embodiments, interior of the composite phase change heat sink main body stores liquid refrigerant, in order to distinguish it from the liquid refrigerant outside the composite phase change heat sink main body, the liquid refrigerant inside the composite phase change heat sink main body is called third liquid refrigerant. The composite phase change heat sink main body may absorb the heat source heat of the server motherboard, and perform vaporization treatment on the third liquid refrigerant according to the heat source heat, to obtain gaseous refrigerant corresponding to the third liquid refrigerant.

Furthermore, the interior of the composite phase change heat sink main body may be a micro/nano boiling enhancement structure. Among them, the micro/nano boiling enhancement structure is formed by a compounding process, and the compounding process may include at least sintering, screen printing, fibers, and grooves. Since the sintering, the screen printing, the fibers, and the grooves belong to the prior art, no further elaboration will be made here.

In some embodiments, due to the vertical arrangement of the composite phase change heat sink main body, the height of the coolant varies at different heights. According to the liquid pressure calculation formula P=pgh, the pressure force at the lower part of the heat sink main body is high. Due to the positive correlation between the boiling point of the phase change liquid and the pressure force, it is easy to cause the boiling point of the lower part to be high, which may lead to the temperature of the lower heat source main body, such as the CPU, being higher than that of the upper heat source main body. Especially when using liquids with high density as the coolant and the heat sink main body is too high, the temperature of the lower CPU will be too high, which will cause significant heat dissipation risks. Therefore, in the embodiments of the present application, the interior of the composite phase change heat sink main body is designed as a compensating exponential curve inclined plane. In some implementations, the micro/nano boiling enhancement structure may be an inclined plane structure with an exponential curve characteristic, and the exponential curve characteristic is used for balancing a boiling point difference at a bottom of the composite phase change heat sink main body. Thus, by increasing the boiling heat transfer area of the bottom heat source, i.e. the number of vaporization cores, to compensate for the boiling point difference between the upper part and the lower part, the temperature of the heat sources (such as CPUs) at different heights inside the composite phase change heat sink main body may be consistent. At the same time, it may also avoid interference from lower bubbles on the upper heat source during the liquid boiling process.

Figure 3:
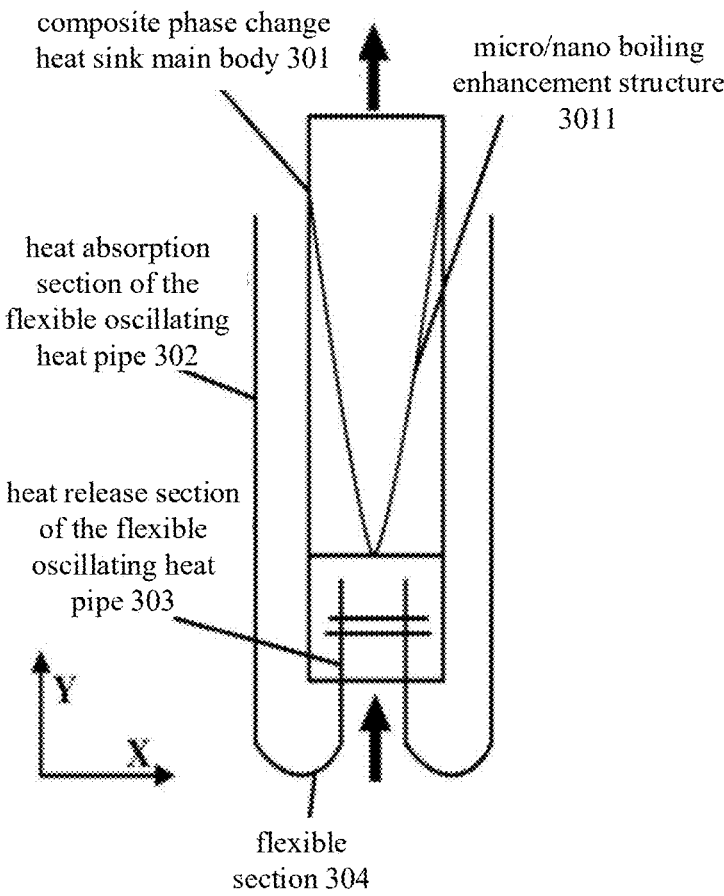
FIG. 3 is a schematic structural diagram of interior of a composite phase change heat sink main body during a liquid cooling cycle process according to an embodiment of the present application.

By way of example, referring to FIG. 3, a schematic structural diagram of interior of a composite phase change heat sink main body during a liquid cooling cycle process according to an embodiment of the present application is shown.

The micro/nano boiling enhancement structure 3011 of the composite phase change heat sink main body 301 is an inclined plane structure with an exponential curve characteristic, and the composite phase change heat sink main body 301 is connected to the flexible oscillating heat pipes through an interface structure. Among them, the flexible oscillating heat pipe includes a heat absorption section of the flexible oscillating heat pipe 302 for absorbing heat and a heat release section of the flexible oscillating heat pipe 303 for releasing heat, and a section between the heat absorption section of the flexible oscillating heat pipe 302 and the heat release section of the flexible oscillating heat pipe 303 is a flexible section 304. Among them, the flexible section 304 may be freely bent, wound, and folded to withstand multiple dynamic bends without damaging the wires in the flexible oscillating heat pipe. It may be arranged arbitrarily according to spatial layout requirements and may move and expand freely in three-dimensional space, thus achieving the connection integration of the heat absorption section of the flexible oscillating heat pipe 302, the heat release section of the flexible oscillating heat pipe 303, and the wires.

Figure 4:
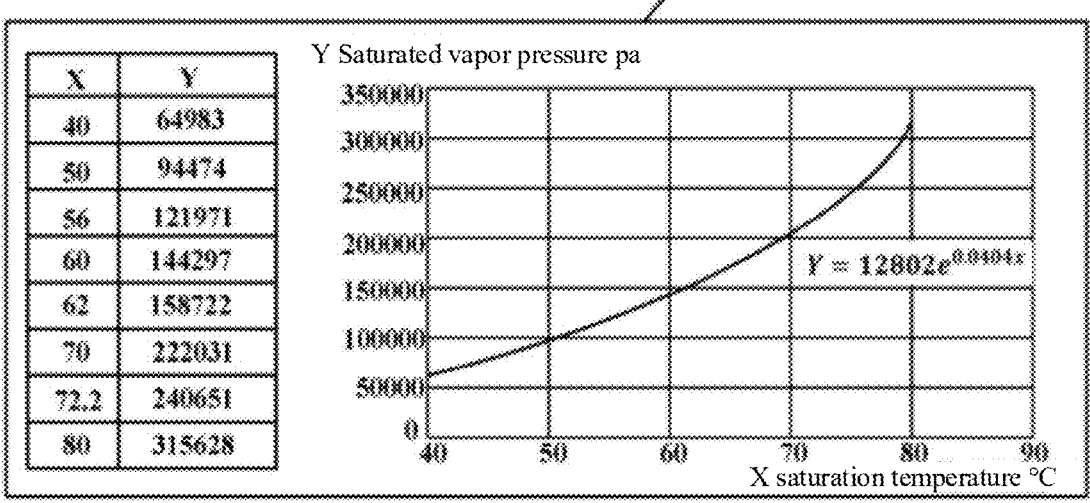
FIG. 4 is a schematic diagram of a relationship between a saturation temperature and a saturated vapor pressure of interior of a composite phase change heat sink main body during a liquid cooling cycle process according to an embodiment of the present application.

Taking electronic fluorinated liquid FC-3284 as an example, referring to FIG. 4, a schematic diagram of a relationship between a saturation temperature and a saturated vapor pressure of interior of a composite phase change heat sink main body during a liquid cooling cycle process according to an embodiment of the present application is shown.

Among them, the Y-axis represents the saturated vapor pressure of electronic fluorinated liquid FC-3284, and the X-axis represents the saturation temperature of electronic fluorinated liquid FC-3284. As can be seen from the figure, within a certain range, the saturated vapor pressure will show an upward trend with the increase of the saturation temperature. The relationship between the two may be expressed as: $Y=K*\alpha^{X}$, where K and a are settable parameters, K and a are not equal to 0, and a is not equal to 1.

As an example, the exponential curve diagram of saturated vapor pressure and saturation temperature shown on the right side of FIG. 4, with K set to 12802 and a set to $e^{0.0404}$, results in the saturated vapor pressure of $Y=12802e^{0.0404X}$. When the saturation temperature X is between 40° C. and 80° C., the saturated vapor pressure Y increases with the increase of the saturation temperature X. For example, when the saturation temperature is 40° C., the saturated vapor pressure is 64983 pa, and when the saturation temperature is 50° C., the saturated vapor pressure is 94474 pa, etc. (referring to the data table on the left side of FIG. 4).

At the same time, the micro/nano boiling enhancement structure of the composite phase change heat sink main body is viewed from another side as a wedge-shaped structure section, mainly aimed at assisting the rapid discharge of the bubbles and avoiding the interference of the bottom bubbles on the upper layer heat transfer in conventional immersion liquid cooling solutions, resulting in gas blockage and overheating in the upper layer. In some implementations, a section of the micro/nano boiling enhancement structure is the wedge-shaped structure section, the wedge-shaped structure section is used for accelerating discharge of bottom bubbles from the composite phase change heat sink main body when performing the vaporization treatment on the third liquid refrigerant.

Figure 5:
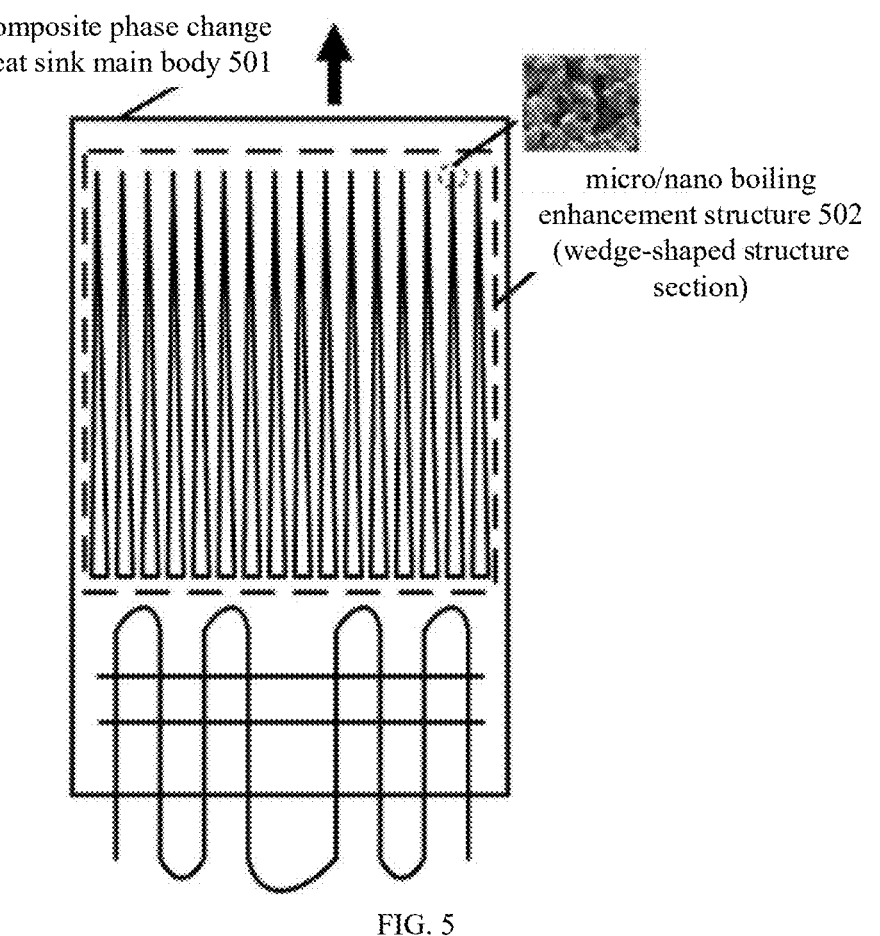
FIG. 5 is a schematic structural diagram of a section of a composite phase change heat sink micro/nano boiling enhancement structure according to an embodiment of the present application.

Taking the sintering process as an example, referring to FIG. 5, a schematic structural diagram of a section of a composite phase change heat sink micro/nano boiling enhancement structure according to an embodiment of the present application is shown.

It can be seen that, the micro/nano boiling enhancement structure 502 of the composite phase change heat sink main body 501 is the wedge-shaped structure section, its characteristic is that the micro/nano boiling enhancement structure 502 is composed of multiple wedge-shaped structures with the upper part being a tip shape and the lower part being wider than the upper part and not the tip shape. Thus, it may accelerate discharge of bottom bubbles from the composite phase change heat sink main body when performing the vaporization treatment on the third liquid refrigerant.

In some embodiments, the flexible oscillating heat pipe may include a condensation promotion peak structure. When the secondary side refrigerant is converted from a liquid state to a gaseous state, the condensation promotion peak structure may promote boiling of the secondary side refrigerant; and when the secondary side refrigerant is converted from the gaseous state to the liquid state, the condensation promotion peak structure may promote condensation of the secondary side refrigerant.

Furthermore, a connection between the heat absorption section of the flexible oscillating heat pipe and the heat release section of the flexible oscillating heat pipe is provided with a flexible section, and the flexible section is a flexible metal sheathed with a metal woven wire mesh. Among them, the flexible section may be freely bent, wound, and folded to withstand multiple dynamic bends without damaging the wires in the flexible oscillating heat pipe. It may be arranged arbitrarily according to spatial layout requirements and may move and expand freely in three-dimensional space, thus achieving the connection integration of the heat absorption section of the flexible oscillating heat pipe, the heat release section of the flexible oscillating heat pipe, and the wires.

In some embodiments, the flexible oscillating heat pipe may include a heat pipe head end and a heat pipe tail end, the flexible oscillating heat pipe is an open cycle oscillating heat pipe, and the open cycle oscillating heat pipe represents that the heat pipe head end is not connected to the heat pipe tail end.

By way of example, referring to FIG. 6, a schematic diagram of an unfolded structure of a flexible oscillating heat pipe according to an embodiments of the present application is shown.

Among them, the flexible oscillating heat pipe is the open cycle oscillating heat pipe 601, the open cycle oscillating heat pipe 601 includes a heat pipe head end 602, a heat pipe tail end 603, a heat absorption section of the flexible oscillating heat pipe 604 (also known as the evaporation section), a heat release section of the flexible oscillating heat pipe 605 (also known as the condensation section), and a condensation promotion peak structure 606. Among them, the heat pipe head end 602 is not connected to the heat pipe tail end 603. When the secondary side refrigerant is converted from the liquid state to the gaseous state, the condensation promotion peak structure 606 may promote boiling of the secondary side refrigerant; and when the secondary side refrigerant is converted from the gaseous state to the liquid state, the condensation promotion peak structure 606 may promote condensation of the secondary side refrigerant.

The connection between the heat absorption section of the flexible oscillating heat pipe 604 and the heat release section of the flexible oscillating heat pipe 605 is provided with a flexible section 607, and the flexible section 607 is a flexible metal sheathed with a metal woven wire mesh.

As another optional embodiment, the flexible oscillating heat pipe is a closed cycle oscillating heat pipe, and the closed cycle oscillating heat pipe represents that the heat pipe head end is connected to the heat pipe tail end.

As an example, referring to FIG. 7, a schematic diagram of an unfolded structure of another flexible oscillating heat pipe according to an embodiments of the present application is shown.

Among them, the flexible oscillating heat pipe is the closed cycle oscillating heat pipe 701, the closed cycle oscillating heat pipe 701 includes a heat pipe head end 702, a heat pipe tail end 703, a heat absorption section of the flexible oscillating heat pipe 704 (also known as the evaporation section), a heat release section of the flexible oscillating heat pipe 705 (also known as the condensation section), and a condensation promotion peak structure 706. Among them, the heat pipe head end 702 is connected to the heat pipe tail end 703. When the secondary side refrigerant is converted from the liquid state to the gaseous state, the condensation promotion peak structure 706 may promote boiling of the secondary side refrigerant; and when the secondary side refrigerant is converted from the gaseous state to the liquid state, the condensation promotion peak structure 706 may promote condensation of the secondary side refrigerant.

The connection between the heat absorption section of the flexible oscillating heat pipe 704 and the heat release section of the flexible oscillating heat pipe 705 is provided with a flexible section 707, and the flexible section 707 is a flexible metal sheathed with a metal woven wire mesh.

Figure 8:
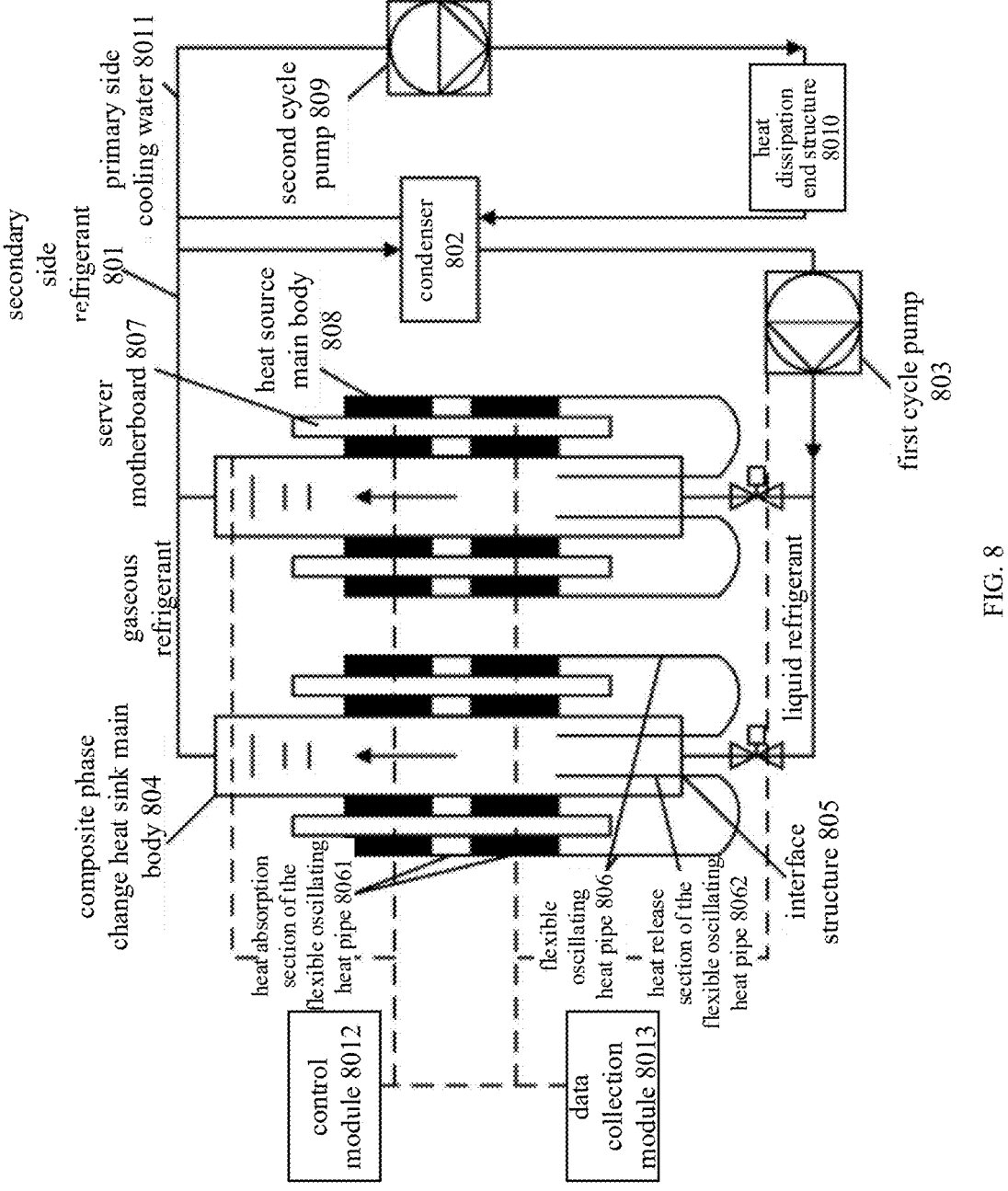
FIG. 8 is a schematic diagram of another liquid cooling cycle system for a server according to an embodiments of the present application.

As another optional embodiment, referring to FIG. 8, a schematic diagram of another liquid cooling cycle system for a server according to an embodiments of the present application is shown.

The liquid cooling cycle system may include at least a secondary side cycle module, the secondary side cycle module may include secondary side refrigerant 801, a condenser 802, a first cycle pump 803 connected to the condenser 802, and at least one composite phase change heat sink structure, among them, each composite phase change heat sink structure may include at least a composite phase change heat sink main body 804, and two flexible oscillating heat pipes 806 respectively connected to two sides of the composite phase change heat sink main body 804 through interface structures 805 (such as welding or quick connectors), and a server motherboard 807 is placed between the composite phase change heat sink main body 804 and one flexible oscillating heat pipe 806 of the two flexible oscillating heat pipes. The server motherboard 807 includes a heat source main body 808.

In some implementations, the flexible oscillating heat pipe 806 is used for absorbing the heat source heat of the server motherboard 8107, and heating first liquid refrigerant in the secondary side refrigerant 801 to the saturated liquid state according to the heat source heat. The flexible oscillating heat pipe 806 includes a heat absorption section of the flexible oscillating heat pipe 8061 and a heat release section of the flexible oscillating heat pipe 8062, and the heat release section of the flexible oscillating heat pipe 8062 is used for: releasing the heat source heat after the heat absorption section of the flexible oscillating heat pipe 8061 absorbs the heat source heat of the server motherboard 807, and heating the first liquid refrigerant in the secondary side refrigerant 801 to the saturated liquid state.

At the same time, the composite phase change heat sink main body 804 is used for absorbing the heat source heat of the server motherboard 807, transporting gaseous refrigerant in the secondary side refrigerant 801 to the condenser 802, and receiving second liquid refrigerant returned by the first cycle pump 803 to complete the liquid cooling cycle for the server.

The condenser 802 is used for performing cooling treatment on the gaseous refrigerant, to obtain second liquid refrigerant corresponding to the gaseous refrigerant, and transporting the second liquid refrigerant to the first cycle pump 803. The first cycle pump 103 is used for receiving the second liquid refrigerant transported by the condenser 802, and cyclically drive the second liquid refrigerant into interior of the composite phase change heat sink main body 804.

Similar to the previous embodiments, the liquid cooling cycle system may further include a primary side cycle module connected to the condenser 802, the primary side cycle module may include a second cycle pump 809 and a heat dissipation end structure 8010 connected to the second cycle pump 809. At the same time, the primary side cycle module further includes primary side cooling water 8011, the primary side cooling water 8011 is used for performing the cooling treatment for the condenser 802. Thus, the second cycle pump 809 may transport the primary side cooling water 8011 flowing through the condenser 802 to the heat dissipation end structure 8010, and the heat dissipation end structure 8010 performs heat dissipation and cooling treatment for the primary side cooling water 8011, and returns the primary side cooling water 8011 after the heat dissipation and cooling treatment to the condenser 802. In addition to achieving the liquid cooling cycle for the server through the cycle operation of the composite phase change heat sink structures, the condenser, and the cycle pump, auxiliary heat dissipation may also be achieved for the condenser through the cooling water cycle method, thus accelerating heat dissipation speed and improving liquid cooling cycle efficiency.

Different from the previous embodiments, the liquid cooling cycle system provided in this embodiment may further include a control module 8012, and the control module 8012 is used for: performing on-off control or operation control on the server motherboard 807, and performing cycle control on the first cycle pump 803. For example, controlling the liquid volume of the liquid refrigerant cyclically driven by the first cycle pump.

Meanwhile, the liquid cooling cycle system may further include a data collection module 8013, and the data collection module 8013 is used for: collecting liquid cooling data of the liquid cooling cycle system, among them, the liquid cooling data may include at least saturation temperature data and saturated vapor pressure data of the secondary side refrigerant (such as the coolant in the micro/nano boiling enhancement structure inside the composite phase change heat sink main body), and temperature data of the server motherboard 807.

In some embodiments, when the heat source power consumption on the side of the flexible oscillating heat pipe is small, for example, when the heat source power consumption is below 200 W, the flexible oscillating heat pipe may be replaced with a flexible heat exchange ring pipe. The detailed cycle process may be as follows: the liquid refrigerant transported from the first cycle pump is first sent into the flexible heat exchange ring pipe. After the heat absorption section of the flexible heat exchange ring pipe absorbs heat, the liquid refrigerant is sent into the composite phase change heat sink main body. Then, the gaseous refrigerant after absorbing heat and undergoing phase change enters the condenser from the top outlet of the composite phase change heat sink main body and returns to the inlet of the first cycle pump. Therefore, in the case of low heat source power consumption on the side of the flexible oscillating heat pipe, the flexible heat exchange ring pipe may be used for replacement, and the corresponding liquid cooling cycle process may be adaptively adjusted and simplified, it makes greater use of the coolant as the secondary side refrigerant, and further reduces maintenance costs.

Figure 9:
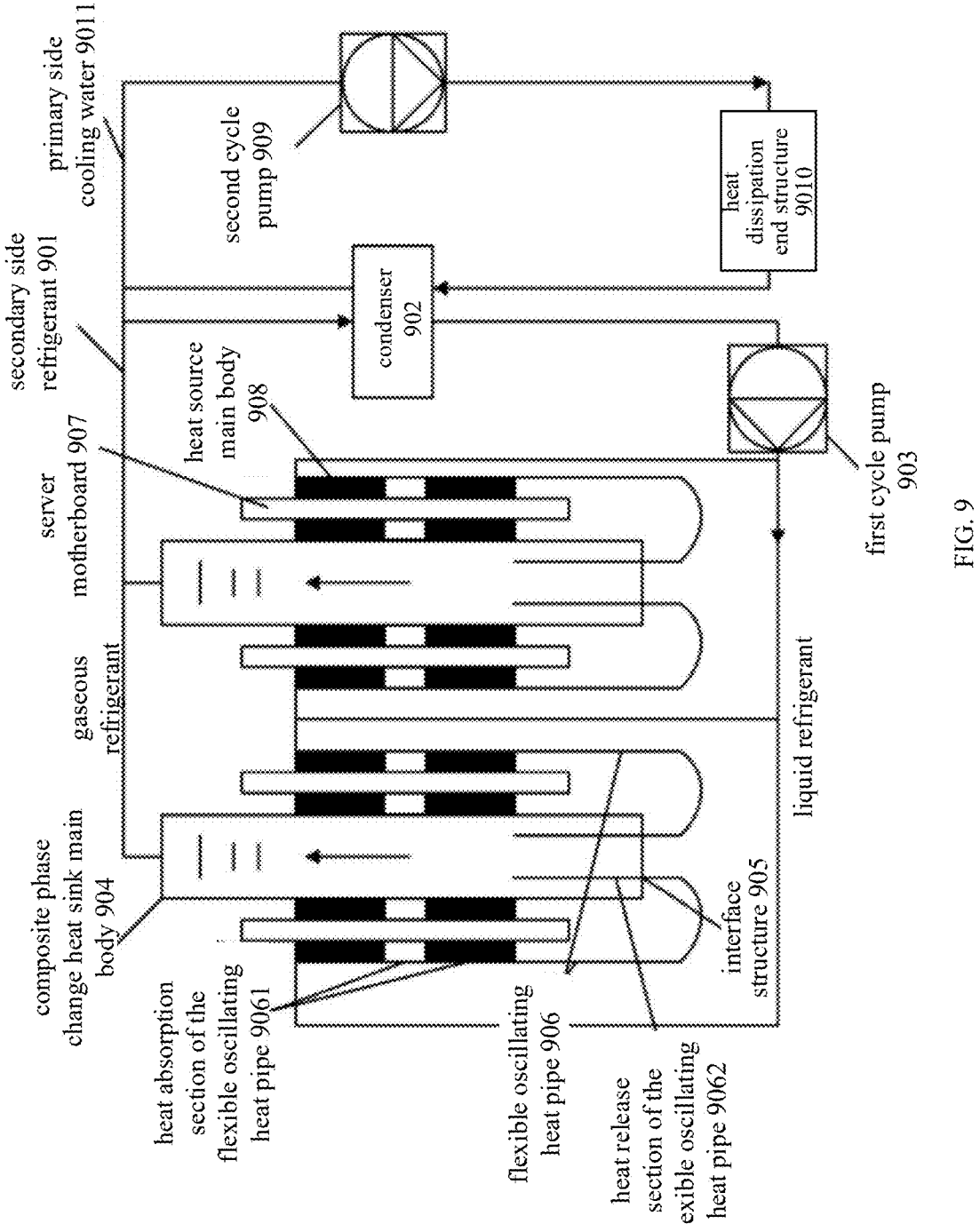
FIG. 9 is a schematic diagram of yet another liquid cooling cycle system for a server according to an embodiments of the present application.

By way of example, referring to FIG. 9, a schematic diagram of yet another liquid cooling cycle system for a server according to an embodiments of the present application is shown.

The liquid cooling cycle system may include at least a secondary side cycle module, the secondary side cycle module may include secondary side refrigerant 901, a condenser 902, a first cycle pump 903 connected to the condenser 902, and at least one composite phase change heat sink structure, among them, each composite phase change heat sink structure may include at least a composite phase change heat sink main body 904, and two flexible oscillating heat pipes 906 respectively connected to two sides of the composite phase change heat sink main body 904 through interface structures 905 (such as welding or quick connectors), the flexible oscillating heat pipe 906 includes a heat absorption section of the flexible oscillating heat pipe 9061 and a heat release section of the flexible oscillating heat pipe 9062, and a server motherboard 907 is placed between the composite phase change heat sink main body 904 and one flexible oscillating heat pipe 906 of the two flexible oscillating heat pipes. The server motherboard 907 includes a heat source main body 908, the heat source main body represents components on the server motherboard that emit heat source heat due to the operation of the server, such as the CPU.

In some implementations, combined with FIG. 9, during the liquid cooling cycle process, the liquid refrigerant transported from the first circulation pump 903 is first sent into the flexible heat exchange ring pipe 906, after the heat absorption section of the flexible heat exchange ring pipe 9061 of the flexible heat exchange ring pipe 906 absorbs heat, the heat release section of the flexible heat exchange ring pipe 9062 heats liquid refrigerant to the saturated liquid state, and the liquid refrigerant heated to the saturated liquid state is sent into the composite phase change heat sink main body 904, and then the gaseous refrigerant converted from the liquid state to the gaseous state after absorbing heat and undergoing phase change enters the condenser 902 from the top outlet of the composite phase change heat sink main body 904 and then returns to the inlet of the first cycle pump 903. Therefore, in the case of low heat source power consumption on the side of the flexible oscillation heat pipe, the flexible heat exchange ring pipe may be used for replacement, and the corresponding liquid cooling cycle process may be adaptively adjusted and simplified, it makes greater use of the coolant as the secondary side refrigerant, and further reduces maintenance costs.

In some embodiments, the liquid cooling cycle system may further include a primary side cycle module connected to the condenser 902, the primary side cycle module may include a second cycle pump 909 and a heat dissipation end structure 9010 connected to the second cycle pump 909. At the same time, the primary side cycle module further includes primary side cooling water 9011, the primary side cooling water 9011 is used for performing the cooling treatment for the condenser 902. Thus, the liquid cooling cycle process of the primary side cycle module may be: by the second cycle pump 909, transporting the primary side cooling water 9011 flowing through the condenser 902 to the heat dissipation end structure 9010, next, by the heat dissipation end structure, performing heat dissipation and cooling treatment for the primary side cooling water 9011, and returning the primary side cooling water 9011 after the heat dissipation and cooling treatment to the condenser 902. In addition to achieving the liquid cooling cycle for the server through the cycle operation of the composite phase change heat sink structures, the condenser, and the cycle pump, auxiliary heat dissipation may also be achieved for the condenser through the cooling water cycle method, thus accelerating heat dissipation speed and improving liquid cooling cycle efficiency.

It should be noted that the embodiments of the present application include but are not limited to the above examples. It should be understood that those skilled in the art may also make settings according to actual needs under the guidance of the ideas of the embodiments of the present application, and the present application does not limit this.

In the embodiments of the present application, a liquid cooling cycle system applied to a server is provided, among them, the liquid cooling cycle system includes at least one composite phase change heat sink structure, each composite phase change heat sink structure includes at least a composite phase change heat sink main body, and two flexible oscillating heat pipes respectively connected to two sides of the composite phase change heat sink main body through interface structures, so that during the liquid cooling cycle process of the server, the phase change conversion between the gaseous refrigerant and the liquid refrigerant may be achieved through the flexible oscillating heat pipes and the composite phase change heat sink main body. When maintaining the server, it only needs to disassemble the flexible oscillating heat pipe for quick and convenient maintenance. At the same time, by designing the interior of the composite phase change heat sink main body as a compensating exponential curve slope and increasing the boiling heat transfer area of the bottom heat source, the temperature of the heat sources of different heights inside the heat sink main body may be consistent, and the risk of heat dissipation is greatly reduced.

Referring to FIG. 10, a flow chart of steps of a liquid cooling cycle method for a server according to an embodiment of the present application is shown. A liquid cooling cycle method is applied to a liquid cooling cycle system of a server, the liquid cooling cycle system includes at least a secondary side cycle module, the secondary side cycle module includes secondary side refrigerant, a condenser, a first cycle pump connected to the condenser, and at least one composite phase change heat sink structure, among them, each composite phase change heat sink structure includes at least a composite phase change heat sink main body, and two flexible oscillating heat pipes respectively connected to two sides of the composite phase change heat sink main body through interface structures, and a server motherboard is placed between the composite phase change heat sink main body and one flexible oscillating heat pipe of the two flexible oscillating heat pipes; and the liquid cooling cycle method may include the following steps:

step 1001, by the flexible oscillating heat pipe, absorbing heat source heat of the server motherboard, and heating first liquid refrigerant in the secondary side refrigerant to a saturated liquid state according to the heat source heat; and step 1002, by the composite phase change heat sink main body, absorbing the heat source heat of the server motherboard, transporting a gaseous refrigerant in the secondary side refrigerant to the condenser for cooling treatment, and receiving second liquid refrigerant returned by the first cycle pump to complete a liquid cooling cycle for the server.

In some embodiments, the method further includes:

by the condenser, performing the cooling treatment on the gaseous refrigerant to obtain second liquid refrigerant corresponding to the gaseous refrigerant, and transporting the second liquid refrigerant to the first cycle pump.

In some embodiments, the method further includes:

by the first cycle pump, receiving the second liquid refrigerant transported by the condenser, and cyclically driving the second liquid refrigerant into interior of the composite phase change heat sink main body.

In some embodiments, interior of the composite phase change heat sink main body stores third liquid refrigerant, and by the composite phase change heat sink main body, absorbing the heat source heat of the server motherboard includes:

by the composite phase change heat sink main body, absorbing the heat source heat of the server motherboard, and performing vaporization treatment on the third liquid refrigerant according to the heat source heat, to obtain gaseous refrigerant corresponding to the third liquid refrigerant.

In some embodiments, the interior of the composite phase change heat sink main body is a micro/nano boiling enhancement structure, the micro/nano boiling enhancement structure is formed by a compounding process, and the compounding process includes at least sintering, screen printing, fibers, and grooves.

In some embodiments, a section of the micro/nano boiling enhancement structure is a wedge-shaped structure section, the wedge-shaped structure section is used for accelerating discharge of bottom bubbles from the composite phase change heat sink main body when performing the vaporization treatment on the third liquid refrigerant.

In some embodiments, the micro/nano boiling enhancement structure is an inclined plane structure with an exponential curve characteristic, and the exponential curve characteristic is used for balancing a boiling point difference at a bottom of the composite phase change heat sink main body.

In some embodiments, the liquid cooling cycle system includes a control module, and the method further includes:

by the control module, performing on-off control on the server motherboard, and performing cycle control on the first cycle pump.

In some embodiments, the liquid cooling cycle system includes a data collection module, and the method further includes:

by the data collection module, collecting liquid cooling data of the liquid cooling cycle system, wherein the liquid cooling data includes at least saturation temperature data and saturated vapor pressure data of the secondary side refrigerant, and temperature data of the server motherboard.

In some embodiments, the server motherboard includes a first heat source main body and a second heat source main body, a motherboard surface where the first heat source main body is located is opposite to a motherboard surface where the second heat source main body is located; and a surface of the first heat source main body is covered with the flexible oscillating heat pipe, and a surface of the second heat source main body is covered with the composite phase change heat sink main body.

In some embodiments, the liquid cooling cycle system further includes a primary side cycle module connected to the condenser, the primary side cycle module includes a second cycle pump and a heat dissipation end structure connected to the second cycle pump.

In some embodiments, the primary side cycle module further includes primary side cooling water, the primary side cooling water is used for performing the cooling treatment for the condenser, and the method further includes:

by the second cycle pump, transporting the primary side cooling water flowing through the condenser to the heat dissipation end structure; and by the heat dissipation end structure, performing heat dissipation and cooling treatment for the primary side cooling water, and returning the primary side cooling water after the heat dissipation and cooling treatment to the condenser.

In some embodiments, the flexible oscillating heat pipe includes a heat pipe head end and a heat pipe tail end, the flexible oscillating heat pipe is an open cycle oscillating heat pipe, and the open cycle oscillating heat pipe represents that the heat pipe head end is not connected to the heat pipe tail end.

In some embodiments, the flexible oscillating heat pipe includes a heat pipe head end and a heat pipe tail end, the flexible oscillating heat pipe is a closed cycle oscillating heat pipe, and the closed cycle oscillating heat pipe represents that the heat pipe head end is connected to the heat pipe tail end.

In some embodiments, the flexible oscillating heat pipe includes a heat absorption section of the flexible oscillating heat pipe and a heat release section of the flexible oscillating heat pipe, and the method further includes:

by the heat release section of the flexible oscillating heat pipe, releasing the heat source heat after the heat absorption section of the flexible oscillating heat pipe absorbs the heat source heat of the server motherboard, and heating the first liquid refrigerant in the secondary side refrigerant to the saturated liquid state.

In some embodiments, the flexible oscillating heat pipe includes a condensation promotion peak structure, and the method further includes:

when the secondary side refrigerant is converted from a liquid state to a gaseous state, promoting, by the condensation promotion peak structure, boiling of the secondary side refrigerant; and when the secondary side refrigerant is converted from the gaseous state to the liquid state, promoting, by the condensation promotion peak structure, condensation of the secondary side refrigerant.

In some embodiments, a connection between the heat absorption section of the flexible oscillating heat pipe and the heat release section of the flexible oscillating heat pipe is provided with a flexible section, and the flexible section is a flexible metal sheathed with a metal woven wire mesh.

For the method implementation example, due to its basic similarity with the system embodiments, the description is relatively simple. For relevant information, please refer to the partial explanation of the system embodiments.

In the embodiments of the present application, a liquid cooling cycle method applied to a liquid cooling cycle system is provided, among them, the liquid cooling cycle system includes at least one composite phase change heat sink structure, each composite phase change heat sink structure includes at least a composite phase change heat sink main body, and two flexible oscillating heat pipes respectively connected to two sides of the composite phase change heat sink main body through interface structures. Firstly, the flexible oscillating heat pipe may absorb the heat source heat of the server motherboard, and heat the first liquid refrigerant in the secondary side refrigerant to the saturated liquid state according to the heat source heat. At the same time, the composite phase change heat sink main body may absorb the heat source heat of the server motherboard, transport a gaseous refrigerant in the secondary side refrigerant to the condenser for cooling treatment, and receive second liquid refrigerant returned by the first cycle pump to complete a liquid cooling cycle for the server. So that during the liquid cooling cycle process of the server, the phase change conversion between the gaseous refrigerant and the liquid refrigerant may be achieved through the flexible oscillating heat pipes and the composite phase change heat sink main body. When maintaining the server, it only needs to disassemble the flexible oscillating heat pipe for quick and convenient maintenance. At the same time, by designing the interior of the composite phase change heat sink main body as a compensating exponential curve slope and increasing the boiling heat transfer area of the bottom heat source, the temperature of the heat sources of different heights inside the heat sink main body may be consistent, and the risk of heat dissipation is greatly reduced.

It should be noted that for the sake of simplicity, the method embodiments are described as a series of action combinations. However, those skilled in the art should be aware that the embodiments of the present application are not limited by the order of the described actions, because according to the embodiments of the present application, certain steps may be performed in other orders or simultaneously. Secondly, those skilled in the art should also be aware that the embodiments described in the specification are all preferred embodiments, and the actions involved are not necessarily necessary for the embodiments of the present application.

In addition, an embodiment of the present application also provides an electronic device, including a processor, a memory, and a computer program stored on the memory and executable on the processor. When the computer program is executed by the processor, it implements the various processes of the liquid cooling cycle method for a server described above and may achieve the same technical effect. To avoid repetition, it will not be repeated here.

As shown in FIG. 11, an embodiment of the present application also provides a non-transitory computer-readable storage medium 1101, which stores a computer program. When the computer program is executed by a processor, it implements the various processes of the liquid cooling cycle method for a server described above and may achieve the same technical effect. To avoid repetition, it will not be repeated here. Among them, the non-transitory computer-readable storage media 1101 may be a Read-Only Memory (ROM), a Random Access Memory (RAM), magnetic disks or optical disks, etc.

Figure 12:
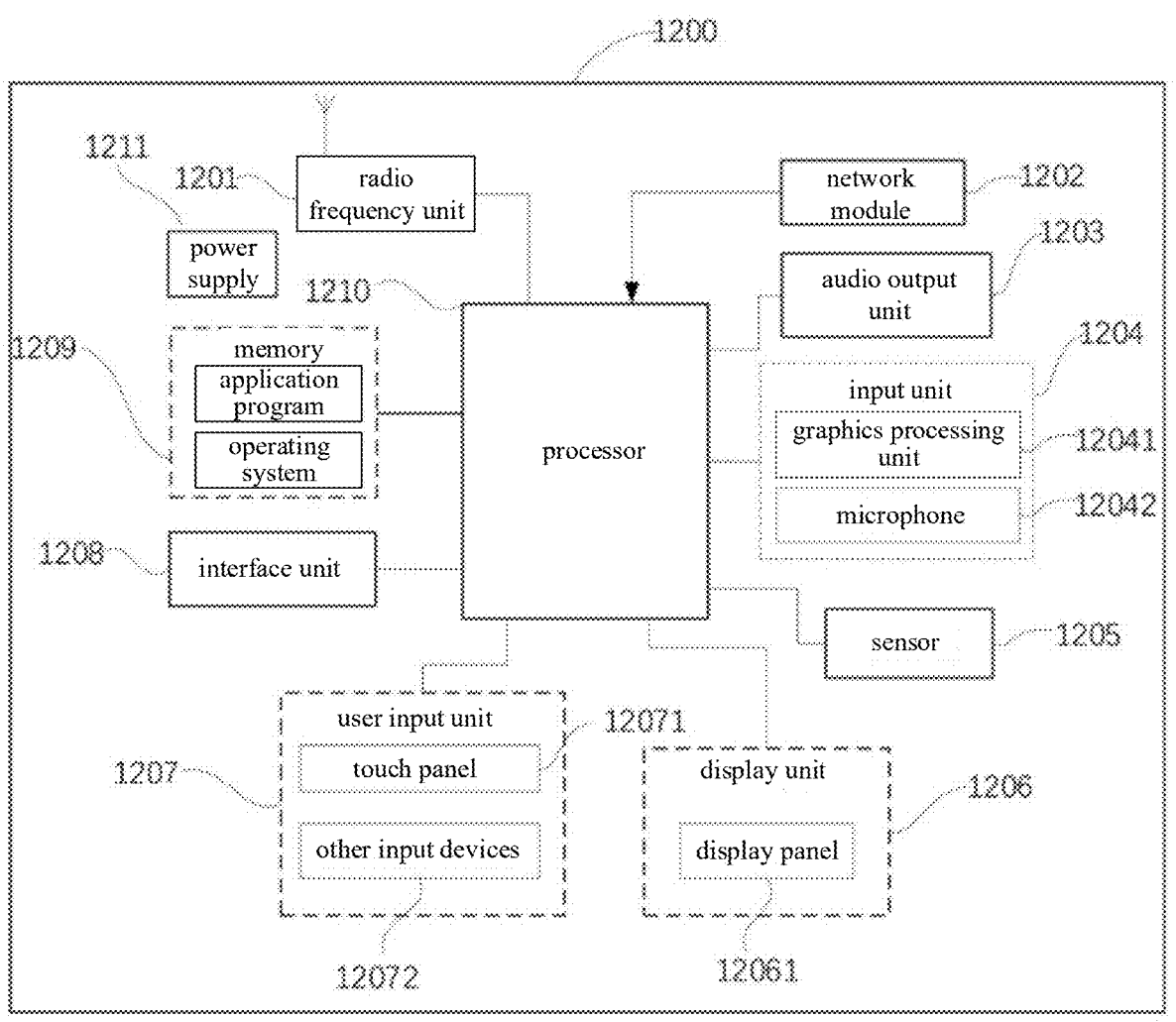
FIG. 12 is a block diagram of an electronic device according to an embodiments of the present application.

FIG. 12 is a schematic diagram of the hardware structure of an electronic device according to some embodiments of the present application.

The electronic device 1200 includes but is not limited to: a radio frequency unit 1201, a network module 1202, an audio output unit 1203, an input unit 1204, a sensor 1205, a display unit 1206, a user input unit 1207, an interface unit 1208, a memory 1209, a processor 1210, and a power supply 1211. Persons skilled in the art may understand that the structure of the electronic device of the embodiment of the present application does not constitute a limitation on the electronic device. The electronic device may include more or fewer components than shown in the diagram, or combine certain components, or arrange different components. In some embodiments of the present application, the electronic devices include but are not limited to mobile phones, tablets, laptops, handheld computers, vehicle terminals, wearable devices, and pedometers.

It should be understood that in some embodiments of the present application, the radio frequency unit 1201 may be used for receiving and transmitting signals during the process of transmitting and receiving information or communication. After receiving downlink data from the base station, it is processed by the processor 1210. In addition, it may send the uplink data to the base station. Generally, the radio frequency unit 1201 includes but is not limited to an antenna, at least one amplifier, a transceiver, a coupler, a low-noise amplifier, a duplexer, etc. In addition, the radio frequency unit 1201 may also communicate with networks and other devices through wireless communication systems.

The electronic devices provide users with wireless broadband Internet access through the network module 1202, such as helping the users send and receive emails, browse web pages, and access streaming media.

The audio output unit 1203 may convert audio data received by the radio frequency unit 1201 or the network module 1202, or stored in the memory 1209, into audio signals and output them as sound. Moreover, the audio output unit 1203 may also provide audio outputs related to detailed functions performed by the electronic device 1200 (such as call signal reception sound, message reception sound, etc.). The audio output unit 1203 includes a speaker, buzzer, and receiver, etc.

The input unit 1204 is used to receive audio or video signals. The input unit 1204 may include a Graphics Processing Unit (GPU) 12041 and a microphone 12042. The GPU 12041 processes image data of static images or videos obtained by an image capture device (such as a camera) in a video capture mode or an image capture mode. The processed image frames may be displayed on the display unit 1206. The image frames processed by the GPU 12041 may be stored in the memory 1209 (or other storage media) or sent via the radio frequency unit 1201 or the network module 1202. The microphone 12042 may receive sound and processing it into audio data. The processed audio data may be converted into a format output that may be sent to a mobile communication base station via the radio frequency unit 1201 in telephone call mode.

The electronic device 1200 also includes at least one sensor 1205, such as a light sensor, a motion sensor, and other sensors. In some embodiments, the light sensor includes an ambient light sensor and a proximity sensor, among them, the ambient light sensor may adjust the brightness of the display panel 12061 according to the brightness of the ambient light, and the proximity sensor may turn off the display panel 12061 and/or backlight when the electronic device 1200 is moved to the ear. As a type of the motion sensor, accelerometer sensors may detect the magnitude of acceleration in various directions (usually three axes), and may detect the magnitude and direction of gravity when stationary. They may be used to recognize postures of the electronic device (such as horizontal and vertical screen switching, related games, magnetometer posture calibration), vibration recognition related functions (such as pedometers, strikes), etc. The sensor 1205 may also include fingerprint sensors, pressure sensors, iris sensors, molecular sensors, gyroscopes, barometers, hygrometers, thermometers, infrared sensors, etc., which will not be repeated here.

The display unit 1206 is used to display information input by the user or information provided to the user. The display unit 1206 may include a display panel 12061, which may be configured in the form of a liquid crystal display (LCD), an organic light-emitting diode (OLED), and so on.

The user input unit 1207 may be used to receive input numerical or character information, as well as generate key signal inputs related to user settings and functional controls of the electronic devices. In some embodiments, the user input unit 1207 includes a touch panel 12071 and other input devices 12072. The touch panel 12071, also known as a touch screen, may collect touch operations of the user on or near it (such as operations of the user using fingers, stylus, or any suitable object or accessory on or near the touch panel 12071). The touch panel 12071 may include two parts: a touch detection device and a touch controller. Among them, the touch detection device detects the touch direction of the user and detects the signal brought by the touch operation, and transmits the signal to the touch controller. The touch controller receives touch information from the touch detection device, converts it into touch point coordinates, and sends them to the processor 1210. It receives commands from the processor 1210 and executes them. In addition, the touch panel 12071 may be implemented using various types such as resistive, capacitive, infrared, and surface acoustic waves. In addition to the touch panel 12071, the user input unit 1207 may also include other input devices 12072. In some embodiments, other input devices 12072 may include but are not limited to physical keyboards, function keys (such as volume control buttons, switch buttons, etc.), trackballs, mouse, and joysticks, which will not be repeated here.

Furthermore, the touch panel 12071 may cover the display panel 12061. When the touch panel 12071 detects a touch operation on or near it, it is transmitted to the processor 1210 to determine the type of a touch event. Subsequently, the processor 1210 provides corresponding visual output on the display panel 12061 based on the type of the touch event. It should be understood that, in an embodiment, the touch panel 12071 and the display panel 12061 are used as two independent components to implement the input and output functions of the electronic device, in some embodiments, the touch panel 12071 and the display panel 12061 may be integrated to achieve the input and output functions of the electronic device, and the details are not limited here.

The interface unit 1208 is the interface for connecting external devices to the electronic device 1200. For example, the external devices may include wired or wireless headphone ports, external power supply (or battery charger) ports, wired or wireless data ports, memory card ports, ports for connecting devices with identification modules, audio input/output (I/O) ports, video I/O ports, headphone ports, and so on. The interface unit 1208 may be used to receive inputs from the external devices (such as data information, power, etc.) and transmit the received inputs to one or more components within the electronic device 1200, or may be used to transmit data between the electronic device 1200 and the external devices.

The memory 1209 may be used to store software programs and various data. The memory 1209 may mainly include a storage program area and a storage data area, among them, the storage program area may store an operating system, at least one application program required for a function (such as a sound playback function, an image playback function, etc.), etc. The storage data area may store data (such as audio data, phone books, etc.) created based on the usage of the mobile phone. In addition, the memory 1209 may include high-speed random access memory, as well as non-transitory memory such as at least one disk storage device, flash memory device, or other transitory solid-state storage device.

The processor 1210 is the control center of the electronic devices, which connects various parts of the entire electronic device through various interfaces and circuits. By running or executing software programs and/or modules stored in the memory 1209, as well as calling data stored in the memory 1209, it performs various functions of the electronic device and processes data, thereby monitoring the electronic device as a whole. The processor 1210 may include one or more processing units. In some embodiments, the processor 1210 may integrate an application processor and a modem processor, among them, the application processor primarily handles operating systems, user interfaces, and application programs, and the modem processor primarily handles wireless communication. It should be understood that the above modem processor may not be integrated into the processor 1210.

The electronic device 1200 may also include a power supply 1211 (such as a battery) that supplies power to various components. In some embodiments, the power supply 1211 may be logically connected to the processor 1210 through a power management system, thereby achieving functions such as managing charging, discharging, and power consumption through the power management system.

In addition, the electronic device 1200 includes some functional modules that are not shown and will not be further elaborated here.

It should be noted that in this specification, the terms "comprising", "including", or any other variation thereof are intended to encompass non-exclusive inclusion, such that a process, method, article, or apparatus that includes a series of elements not only includes those elements, but also includes other elements not explicitly listed, or also includes elements inherent to such process, method, article, or apparatus. Without further limitations, the element limited by the statement "including one . . . " does not exclude the existence of other identical elements in the process, method, article, or device that includes that element.

Through the description of the above implementation methods, persons skilled in the art may clearly understand that the above implementation methods may be implemented through software and necessary general hardware platforms. Certainly, they may also be implemented through hardware, but in many cases, the former is the better implementation method. Based on this understanding, the technical solution of the present application may essentially or contribute to the existing technology in the form of a software product, which is stored in a storage medium (such as ROM/RAM, magnetic disk, optical disk) and includes several instructions to enable a terminal (which may be a mobile phone, computer, server, air conditioner, or network device, etc.) to execute the methods of various embodiments of the present application.

The embodiments of the present application have been described above in conjunction with the accompanying drawings, but the present application is not limited to the embodiments described above. The embodiments described above are only illustrative and not restrictive. Persons skilled in the art may also make many forms within the scope of protection of the present application without departing from the purpose and claims of the present application.

Persons skilled in the art may realize that the units and algorithm steps described in the embodiments disclosed in the present application may be implemented through electronic hardware, or a combination of computer software and electronic hardware. Whether these functions are executed in hardware or software depends on the application and design constraints of the technical solution. Professional technicians may use different methods to achieve the described functions for each application, but such implementation should not be considered beyond the scope of the present application.

Persons skilled in the art may clearly understand that, for the sake of convenience and simplicity in description, the working processes of the systems, devices, and units described above may refer to the corresponding processes in the aforementioned method embodiments, which will not be repeated here.

In the embodiments provided in the present application, it should be understood that the disclosed devices and methods may be implemented in other ways. For example, the device embodiments described above are only illustrative. For example, the division of units is only a logical function division. In practical implementation, there may be other division methods, such as multiple units or components being combined or integrated into another system, or some features being ignored or not executed. On the other hand, the mutual coupling or direct coupling or communication connection displayed or discussed may be indirect coupling or communication connection through some interface, device or unit, which may be electrical, mechanical or other forms.

The units described as separate components may or may not be physically separated, and the components displayed as units may or may not be physical units, i.e., they may be located in one place or distributed across multiple network units. Some or all of the units may be selected according to actual needs to achieve the purpose of this embodiment.

In addition, the functional units in various embodiments of the present application may be integrated into one processing unit, physically exist separately, or integrate two or more units into one unit.

If the function is implemented in the form of software functional units and sold or used as an independent product, it may be stored in a computer-readable storage medium. Based on this understanding, the technical solution of the present application essentially or partially contributes to the prior art or may be embodied in the form of a software product. The computer software product is stored in a storage medium and includes several instructions to enable a computer device (which may be a personal computer, server, or network device, etc.) to perform all or part of the steps of the various embodiments of the present application. The aforementioned storage media include various media that may store program code, such as USB flash drives, portable hard drives, ROMs, RAMs, disks, or CDs.

In addition, the embodiments of the present application may involve the use of user data. In practical applications, user specific personal data may be used in the solution described in this specification within the scope permitted by applicable laws and regulations, provided that it complies with the requirements of applicable laws and regulations in the host country (such as explicit consent from the user, effective notification to the user, etc.).

The above are only some implementations of the present application, but the scope of protection of the present application is not limited to this. Any person skilled in the art may easily think of changes or replacements within the technical scope disclosed in the present application, which should be included in the scope of protection of the present application. Therefore, the scope of protection of the present application should be based on the scope of protection of the claims.

The invention claimed is:

1. A liquid cooling cycle system applied to a server, wherein the liquid cooling cycle system comprises at least a secondary side cycle module, the secondary side cycle module comprises secondary side refrigerant, a condenser, a first cycle pump connected to the condenser, and at least one composite phase change heat sink structure, wherein each composite phase change heat sink structure comprises at least a composite phase change heat sink main body, and two flexible oscillating heat pipes respectively connected to two sides of the composite phase change heat sink main body through interface structures, and a server motherboard is placed between the composite phase change heat sink main body and one flexible oscillating heat pipe of the two flexible oscillating heat pipes; wherein the flexible oscillating heat pipe is used for absorbing heat source heat of the server motherboard, and heating first liquid refrigerant in the secondary side refrigerant to a saturated liquid state according to the heat source heat; and the composite phase change heat sink main body is used for absorbing the heat source heat of the server motherboard, transporting gaseous refrigerant in the secondary side refrigerant to the condenser for cooling treatment, and receiving second liquid refrigerant returned by the first cycle pump to complete a liquid cooling cycle for the server.

2. The liquid cooling cycle system according to claim 1, wherein the condenser is used for:

performing the cooling treatment on the gaseous refrigerant to obtain second liquid refrigerant corresponding to the gaseous refrigerant, and transporting the second liquid refrigerant to the first cycle pump.

3. The liquid cooling cycle system according to claim 1, wherein the first cycle pump is used for:

receiving the second liquid refrigerant transported by the condenser, and cyclically driving the second liquid refrigerant into interior of the composite phase change heat sink main body.

4. The liquid cooling cycle system according to claim 1, wherein interior of the composite phase change heat sink main body stores third liquid refrigerant, and the composite phase change heat sink main body is used for:

absorbing the heat source heat of the server motherboard, and performing vaporization treatment on the third liquid refrigerant according to the heat source heat, to obtain gaseous refrigerant corresponding to the third liquid refrigerant.

5. The liquid cooling cycle system according to claim 4, wherein the interior of the composite phase change heat sink main body is a micro/nano boiling enhancement structure, the micro/nano boiling enhancement structure is formed by a compounding process, and the compounding process comprises at least sintering, screen printing, fibers, and grooves.

6. The liquid cooling cycle system according to claim 5, wherein a section of the micro/nano boiling enhancement structure is a wedge-shaped structure section, the wedge-shaped structure section is used for accelerating discharge of bottom bubbles from the composite phase change heat sink main body when performing the vaporization treatment on the third liquid refrigerant.

7. The liquid cooling cycle system according to claim 5, wherein the micro/nano boiling enhancement structure is an inclined plane structure with an exponential curve characteristic, and the exponential curve characteristic is used for balancing a boiling point difference at a bottom of the composite phase change heat sink main body.

8. The liquid cooling cycle system according to claim 1, wherein the liquid cooling cycle system comprises a control module, and the control module is used for:

performing on-off control on the server motherboard, and performing cycle control on the first cycle pump.

9. The liquid cooling cycle system according to claim 1, wherein the liquid cooling cycle system comprises a data collection module, and the data collection module is used for:

collecting liquid cooling data of the liquid cooling cycle system, wherein the liquid cooling data comprises at least saturation temperature data and saturated vapor pressure data of the secondary side refrigerant, and temperature data of the server motherboard.

10. The liquid cooling cycle system according to claim 1, wherein the server motherboard comprises a first heat source main body and a second heat source main body, a motherboard surface where the first heat source main body is located is opposite to a motherboard surface where the second heat source main body is located; and a surface of the first heat source main body is covered with the flexible oscillating heat pipe, and a surface of the second heat source main body is covered with the composite phase change heat sink main body.

11. The liquid cooling cycle system according to claim 1, wherein the liquid cooling cycle system further comprises a primary side cycle module connected to the condenser, the primary side cycle module comprises a second cycle pump and a heat dissipation end structure connected to the second cycle pump.

12. The liquid cooling cycle system according to claim 11, wherein the primary side cycle module further comprises primary side cooling water, the primary side cooling water is used for performing the cooling treatment for the condenser, and the second cycle pump is used for:

transporting the primary side cooling water flowing through the condenser to the heat dissipation end structure; and the heat dissipation end structure is used for performing heat dissipation and cooling treatment for the primary side cooling water, and returning the primary side cooling water after the heat dissipation and cooling treatment to the condenser.

13. The liquid cooling cycle system according to claim 1, wherein the flexible oscillating heat pipe comprises a heat pipe head end and a heat pipe tail end, the flexible oscillating heat pipe is an open cycle oscillating heat pipe, and the open cycle oscillating heat pipe represents that the heat pipe head end is not connected to the heat pipe tail end.

14. The liquid cooling cycle system according to claim 1, wherein the flexible oscillating heat pipe comprises a heat pipe head end and a heat pipe tail end, the flexible oscillating heat pipe is a closed cycle oscillating heat pipe, and the closed cycle oscillating heat pipe represents that the heat pipe head end is connected to the heat pipe tail end.

15. The liquid cooling cycle system according to claim 13, wherein the flexible oscillating heat pipe comprises a heat absorption section of the flexible oscillating heat pipe and a heat release section of the flexible oscillating heat pipe, and the heat release section of the flexible oscillating heat pipe is used for:

releasing the heat source heat after the heat absorption section of the flexible oscillating heat pipe absorbs the heat source heat of the server motherboard, heating the first liquid refrigerant in the secondary side refrigerant to the saturated liquid state.

16. The liquid cooling cycle system according to claim 13, wherein the flexible oscillating heat pipe comprises a condensation promotion peak structure, and the condensation promotion peak structure is used for:

when the secondary side refrigerant is converted from a liquid state to a gaseous state, promoting boiling of the secondary side refrigerant; and when the secondary side refrigerant is converted from the gaseous state to the liquid state, promoting condensation of the secondary side refrigerant.

17. The liquid cooling cycle system according to claim 15, wherein a connection between the heat absorption section of the flexible oscillating heat pipe and the heat release section of the flexible oscillating heat pipe is provided with a flexible section, and the flexible section is a flexible metal sheathed with a metal woven wire mesh.

18. A liquid cooling cycle method applied to a server, wherein the liquid cooling cycle method is applied to a liquid cooling cycle system of a server, the liquid cooling cycle system comprises at least a secondary side cycle module, the secondary side cycle module comprises secondary side refrigerant, a condenser, a first cycle pump connected to the condenser, and at least one composite phase change heat sink structure, wherein each composite phase change heat sink structure comprises at least a composite phase change heat sink main body, and two flexible oscillating heat pipes respectively connected to two sides of the composite phase change heat sink main body through interface structures, and a server motherboard is placed between the composite phase change heat sink main body and one flexible oscillating heat pipe of the two flexible oscillating heat pipes; and the method comprises:

by the flexible oscillating heat pipe, absorbing heat source heat of the server motherboard, and heating first liquid refrigerant in the secondary side refrigerant to a saturated liquid state according to the heat source heat; and by the composite phase change heat sink main body, absorbing the heat source heat of the server motherboard, transporting a gaseous refrigerant in the secondary side refrigerant to the condenser for cooling treatment, and receiving second liquid refrigerant returned by the first cycle pump to complete a liquid cooling cycle for the server.

19. A non-transitory computer-readable storage medium, storing instructions that, when executed by one or more processors, cause the processors to perform the method according to claim 18.

20. An electronic device, comprising a processor, a communication interface, a memory, and a communication bus, wherein the processor, the communication interface, and the memory communicate with each other through the communication bus;

the memory is used for storing a computer program; and the processor is used for, when executing the program stored on the memory, implementing operations applied to a liquid cooling cycle system of a server, wherein the liquid cooling cycle system comprises at least a secondary side cycle module, the secondary side cycle module comprises secondary side refrigerant, a condenser, a first cycle pump connected to the condenser, and at least one composite phase change heat sink structure, wherein each composite phase change heat sink structure comprises at least a composite phase change heat sink main body, and two flexible oscillating heat pipes respectively connected to two sides of the composite phase change heat sink main body through interface structures, and a server motherboard is placed between the composite phase change heat sink main body and one flexible oscillating heat pipe of the two flexible oscillating heat pipes; and the operations comprise:

by the flexible oscillating heat pipe, absorbing heat source heat of the server motherboard, and heating first liquid refrigerant in the secondary side refrigerant to a saturated liquid state according to the heat source heat; and by the composite phase change heat sink main body, absorbing the heat source heat of the server motherboard, transporting a gaseous refrigerant in the secondary side refrigerant to the condenser for cooling treatment, and receiving second liquid refrigerant returned by the first cycle pump to complete a liquid cooling cycle for the server.

\* \* \* \* \*